(12) United States Patent
Rasmussen

(10) Patent No.: US 7,425,851 B2
(45) Date of Patent: Sep. 16, 2008

(54) PHASE-LOCKED LOOP WITH INCREMENTAL PHASE DETECTORS AND A CONVERTER FOR COMBINING A LOGICAL OPERATION WITH A DIGITAL TO ANALOG CONVERSION

(75) Inventor: Carsten Rasmussen, Frederiksberg (DK)

(73) Assignee: R & C Holding APS (DK)

( * ) Notice: Subject to any disclaimer, the term of this patent is extended or adjusted under 35 U.S.C. 154(b) by 706 days.

(21) Appl. No.: 10/518,740

(22) PCT Filed: Jun. 18, 2003

(86) PCT No.: PCT/DK03/00404

§ 371 (c)(1),
(2), (4) Date: Dec. 17, 2004

(87) PCT Pub. No.: WO04/001974

PCT Pub. Date: Dec. 31, 2003

(65) Prior Publication Data

US 2005/0220181 A1    Oct. 6, 2005

(30) Foreign Application Priority Data

Jun. 19, 2002    (DK) ............................... 2002 00933

(51) Int. Cl.
*H03L 7/06* (2006.01)
(52) U.S. Cl. .............................. 327/156; 327/2; 327/12
(58) Field of Classification Search ...................... 327/2, 327/12
See application file for complete search history.

(56) References Cited

U.S. PATENT DOCUMENTS 5,317,283 A    5/1994   Korhonen ................... 331/1 A
5,373,255 A   12/1994   Bray et al. .................. 331/1 A (Continued)

FOREIGN PATENT DOCUMENTS

EP    0 607 677 A2    7/1994

(Continued)

*Primary Examiner*—Tuan T. Lam
*Assistant Examiner*—Daniel Rojas
(74) *Attorney, Agent, or Firm*—Gifford Krass Sprinkle Anderson & Citkowski

(57) ABSTRACT

The invention relates to a phase-locked loop comprising a voltage controlled oscillator and having a frequency control input for controlling the frequency of the output signal. The phase-locked loop also has a phase comparator for deriving a control signal from a phase error detected in response to a received output signal and a reference signal. The control signal is coupled to the frequency control input of said voltage controlled oscillator. The phase comparator includes a first and a second predefined phase step value to a first accumulated phase value, and the phase comparator has means for determining the phase error. The phase comparator may further have circuit means for performing a first and a second AND operation on the outputs from the first and second accumulators and for obtaining analogue signals corresponding to the outputs of the AND operations. The invention also relates to a method for obtaining information on a phase error between two signals. The invention also relates to a phase comparator for use in a phase-locked loop. The invention further relates to a digital to analogue converter, which converter may combine a logic operation with a digital to analogue conversion.

18 Claims, 14 Drawing Sheets

U.S. PATENT DOCUMENTS

| | | | |
|---|---|---|---|
| 5,459,435 A | 10/1995 | Taki | 331/1 A |
| 5,656,976 A | 8/1997 | Jung et al. | 331/18 |
| 5,909,130 A | 6/1999 | Martin et al. | 327/12 |
| 5,999,060 A | 12/1999 | Zuta | 331/14 |
| 6,046,643 A | 4/2000 | Kranz | 331/1 A |
| 6,075,387 A | 6/2000 | Urbansky | 327/2 |
| 6,188,288 B1 | 2/2001 | Ragan et al. | 331/16 |

FOREIGN PATENT DOCUMENTS

| | | |
|---|---|---|
| GB | 0 607 677 A2 | 7/1994 |

PHASE-LOCKED LOOP WITH INCREMENTAL PHASE DETECTORS AND A CONVERTER FOR COMBINING A LOGICAL OPERATION WITH A DIGITAL TO ANALOG CONVERSION

FIELD OF THE INVENTION

The present invention relates to a phase-locked loop, and more particularly to a phase-locked loop having a phase comparator with a phase error being derived from the outputs of incremental phase detectors.

The invention also relates to a method for determining a phase error in response to a first signal and a second signal and a phase comparator for carrying out the method.

The present invention further relates to a digital to analogue converter, and more particularly to a converter for combining a logical operation with a digital to analogue conversion.

BACKGROUND OF THE INVENTION

Phase-locked loops are used in a variety of applications. In general, phase-locked loops include a phase comparator or phase detector to compare the phase of a frequency-divided output signal of the voltage controlled oscillator and a reference signal. The difference between these two signals is used to generate a control signal or error signal, which is fed back to the voltage controlled oscillator so as to control the frequency of its signal output in a direction that reduces this phase difference. For example, phase-locked loops are used in different types of radio systems, such as cellular phones, in which an oscillator is locked to an accurate reference frequency. Different means are then provided to scale this accurate reference frequency to the desired frequency.

In a conventional phase-locked loop (PLL) it is well known to divide the output signal of the voltage controlled oscillator (VCO) by a natural number. The division may be performed by a divider or frequency divider. The reason to perform the division is because comparators according to the prior art only are able to compare the phase of two signals if the frequency of the two signals to be compared are equal and because the output frequency usually is "high" (MHz or GHz range) it is easier/more feasible to have the control circuit to work at a lower frequency. In some embodiments the reference clock may also be divided by a natural number by a frequency divider in order to obtain a given frequency of the two signals to be compared.

When using a conventional phase-locked loop some unwanted frequency components or spurious occur in the output signal. These spurious occur as a result of the phase comparator (also called phase detector) working at a frequency given hereby. The spurious are an unwanted effect as it most often reduces the overall performance of the system in which the phase-lock loop is operating. For example, spurious on the carrier in a radio system is a disadvantage as it causes undesired channels to interfere with the desired channel and thereby reducing the over-all performance of the radio system.

According to the prior art, a solution to this problem is to filter out the spurious by use of a loop filter, most often located between the phase comparator and the voltage-controlled oscillator, i.e. the control signal for the voltage-controlled oscillator is filtered. Generally the spurious can be filtered out in a loop filter if the bandwidth of the loop filter is significantly small, e.g. smaller than the distance between the spurious. But the price of reducing the bandwidth of the loop filter is a slower PLL, i.e. the lock-in time for the PLL is increased.

Some if not most prior art phase-locked loops, which are fully or partly implemented using digital components, also have a risk of producing sub-harmonic frequencies due to the way they are implemented. This is due to the way the two signals, the reference signal and the output signal, interact with each other. Ideally the reference signal and the output signal operates asynchronous, where the phase lock is established when the phases coincide. Until this happens and if a disturbance breaks the lock there may occur sub-harmonics.

U.S. Pat. No. 5,459,435 shows a digital implementation of a PLL. The invention is a straight forward conversion of the known analog PLL topology, where a first and a second counter unit is used to indicate the phase error between the frequency divided output signal and the reference. The resolution of the PLL is fixed to the bit resolution of the digital implementation thus fixing the ratios between output frequency and reference frequency.

U.S. Pat. No. 5,999,060 also shows a digital implementation of a PLL using counters. As with U.S. Pat. No. 5,459,435 the resolution of the PLL is firstly fixed to the bit resolution, but is secondly compensated by a scaling means in the feed back. The scaling means gives the possibility to increase the number of possible output frequencies.

U.S. Pat. No. 6,188,288 is similar in many ways to U.S. Pat. No. 5,999,060 in that some scaling means is used in the feed back to compensate for the bit resolution. U.S. Pat. No. 6,188, 288 differs from the above mentioned PLL's in that a current controlled oscillator is used and not a voltage controlled oscillator.

The above mentioned PLL introduces means for increasing the number of possible output frequencies. They also increase the complexity of the PLL-circuit considerably and do not improve on the lock-in time for the PLL, because a loop filter with a narrow bandwidth is still needed.

In U.S. Pat. No. 6,046,643 is described a digital implementation of a PLL circuit. Here, a frequency divider with a fixed division rate has the output of the voltage controlled oscillator as input, and the output of the divider supplies a first clock signal to a first accumulator, which aggregates a first reference signal under control of the first clock signal. A second accumulator aggregates a second reference signal under the control of the reference clock signal. The aggregated signals are subtracted from one another, filtered through a digital filter, weighted and then converted into an analogue signal, This analogue signal is filtered by an analogue filter and fed to the voltage controlled oscillator. Thus, the difference between the two aggregated signals may be used for generating a control or error signal for controlling the frequency of the voltage controlled oscillator in a direction to reduce the difference between the two aggregated signals, and the output frequency may be selected by a suitable selection of the first and second reference signals. However, the two aggregated signals from the two accumulators are asynchronous signals, thereby generating a problem for the subtraction process. In U.S. Pat. No. 6,046,643 there is nowhere giving a solution for performing such a subtraction of two asynchronous signals, except for the filtering processes following the subtraction.

SUMMARY OF THE INVENTION

An object of the present invention is to provide an improved phase-locked loop, which may have a fast lock-in time, minimum risk for sub-harmonics in the output, and which can be implemented in a simple circuit.

It is also an object of the present invention to provide a solution to the subtraction of two asynchronous digital signals to obtain a phase error signal, which may be used to obtain an improved phase-locked loop circuit.

In order to provide the phase error signal, an analogue signal may be obtained from the two subtracted asynchronous digital signals, which may include the use of one or more digital to analogue converters. Thus, it is also an object of the invention to provide a solution to a converter circuit for obtaining an analogue presentation of one or more digital input signals.

According to a first aspect of the invention, there is provided a phase-locked loop comprising:
a voltage controlled oscillator for generating an output signal and having a frequency control input for controlling the frequency of the output signal, and
a phase comparator for deriving a control signal from a phase error detected in response to the received output signal and a reference signal, said control signal being coupled to the frequency control input of said voltage controlled oscillator,
wherein the phase comparator includes:
a first accumulator adapted to add a first predefined phase step value to a first accumulated phase value in response to a reoccurring event in the reference signal,
a second accumulator adapted to add a second predefined phase step value to a second accumulated phase value in response to a reoccurring event in the received output signal, and
means or arithmetic means for determining the phase error from the obtained first and second accumulated phase values.

According to an embodiment of the invention, the means for determining the phase error from the obtained first and second accumulated phase values may be adapted to derive the control signal based on the obtained phase error or to derive the control signal from the obtained first and second accumulated phase values, whereby the control signal may represent the phase error.

A PLL of this type may have a large loop-bandwidth, which is independent of the division ratio and consequently a fast lock-in time. The loop-bandwidth may be large because, as shown later, the spurious in the output to a large degree may be placed as desired, thus allowing for a loop-filter with a wider bandwidth.

Because the loop-bandwidth may be larger, the time-constant of the loop may be smaller. Therefore it may be cheaper to integrate a PLL of this type because the sizes of the loop-components are smaller and thereby take up a smaller die array.

Because the loop-bandwidth may be independent of the division ratio, the PLL can compensate for frequency errors in references, and thereby eliminate the need of using voltage controlled temperature compensated crystal oscillators (VCTXCO) or voltage controlled crystal oscillators (VCXO), which is used in nearly all wireless radio systems and other communications systems. VCTCXO and VCXO is normally an expensive circuit and can be replaced with a more simple crystal oscillator which normally has better phase noise performance than VCTCXO and VCXO.

Also, because the loop-bandwidth may be larger it is possible to suppress narrowband phase noise of the VCO in a wider bandwidth around the carrier and hereby improving the overall performance of the PLL. This means that VCO does not have to have as good narrowband phase-noise performance as for a traditional PLL system. Because resonators on an integrated circuit has very low Q-values, the performance of integrated VCO are usually not as good as a discreet solution. In some systems this gives the possibility to fully integrate the VCO where it would not be possible using a traditional system.

Further, because the PLL may have a fast lock-in time, it is possible to direct-digital-modulate the PLL by changing the predefined phase step values ($N_R$ and $N_V$). This means that the up-converter can be eliminated in systems using frequency shift keying (FSK) and phase shift keying (PSK).

According to a preferred embodiment of the invention the phase-locked loop may further comprise a divider for dividing the frequency of the output signal, whereby the received output signal received by the phase comparator is a frequency-divided output signal.

It is preferred that the arithmetic means are subtracting means for determining the phase error by a subtraction between the obtained first and second accumulated phase values. Here, the subtracting means may be adapted for subtracting the second accumulated phase value from the first accumulated phase value.

According to a preferred embodiment of the invention, the phase comparator includes a digital-to-analogue converter adapted to convert the phase error and thereby to generate an analogue output signal. Hereby the phase-locked loop may achieve a very large internal amplification—an amplification that approaches infinite—so the bandwidth of the phase-locked loop is determined primarily by the loop filter.

It is also within a preferred embodiment of the invention that the phase comparator includes a converter circuit having:
means for performing a first logic bit by bit AND operation of the output of the first accumulator and the inverted output of the second accumulator, and for generating a first analogue representation of said first logic bit by bit AND operation, and
means for performing a second logic bit by bit AND operation of the output of the second accumulator and the inverted output of the first accumulator, and for generating a second analogue representation of said second logic bit by bit AND operation.

Here, the converter circuit may comprise current mode logic circuits giving a current output for a two input AND operation, and the current output may be used for generating an analogue representation for a bit by bit AND operation. It is preferred that the arithmetic means are adapted to obtain one or two analogue phase error signals based on the second analogue representation of the second logic bit by bit AND operation and the first analogue representation of the first logic bit by bit AND operation. The arithmetic means may comprise subtraction means being adapted for performing an analogue subtraction of the second analogue representation from the first analogue representation.

According to a preferred embodiment of the invention, the phase comparator includes a first and a second digital-to-analogue converter adapted to convert the first and the second accumulated phase values and thereby to generate analogue representations thereof. It is further preferred that arithmetic means are adapted to perform an analogue subtraction of the analogue representation of the second accumulated phase value from the analogue representation of the first accumulated phase value. This may be advantageous due the fact that the reference signal and the output signal essentially operate asynchronously. Due to the way a digital subtraction may be carried out, it may be difficult to implement an asynchronously digital subtraction which will operate momentously or need to operate momentously without generating spikes or hazards on the output, which may cause spurious or in worst case mall function.

According to a preferred embodiment of the invention, the phase comparator includes a first and a second AND-means, where the output of said first AND-means is connected to a first digital-to-analogue converter, whereby a first accumulator is connected to a first non-inverting input of said first AND-means and whereby a second accumulator is connected to a first inverting input of said first AND-means, the output of said second AND-means being connected to said second digital-to-analogue converter, and that said second accumulator further is connected to a first non-inverting input of said second AND-means, said first accumulator further being connected to a first inverting input of said second AND-means. The digital-to-analogue converters have a settling time—the time from a digital input is applied to the digital-to-analogue converter until a stable output is achieved—which may cause large but short lived errors when the more-significant bit changes, especially the most significant bit. This is especially a problem, because the reference signal and the output signal essentially operate asynchronously. Furthermore, due to the way digital addition (subtraction) is done inside the component, there may be a short ripple in the output from the component. By using an AND-means, the digital number is pre-processed, facilitating a more error-free output from the digital-to-analogue converter.

According to a preferred embodiment of the invention, the phase comparator includes a first reset means for the most significant bit of the first accumulator, a second reset means for the most significant bit of the second accumulator, and a third AND-means, where the output of said third AND-means is connected to said first and said second reset means of said first and said second accumulator, where the most significant bit of said first accumulator is connected to a first non-inverting input of said third AND-means, and where the most significant bit of said second accumulator is connected to a second non-inverting input of said third AND-means. The intended output from the phase comparator is the phase difference between the two signals and not their absolute value. By using reset means for the most significant bit of said first and second accumulator numerical overflows of the accumulators may be prevented and at the same time the output from the phase comparator may remain the same. As described above, the most significant bits of the accumulator are reset and the resetting is controlled by the most significant bits of the inputs to the digital-to-analogue converter. The same function may be achieved by using any of the bits and any number of resets.

The invention also relates to a method of detecting a phase error between or in response to a first signal and a second signal. Thus, according to a second aspect of the invention there is provided a method for determining a phase error in response to a first signal and a second signal, said method comprising the steps of:
generating a first reoccurring trigger event in response to the first signal,
generating a second reoccurring trigger event in response to the second signal,
incrementing a first phase value by a first predetermined increment value when the first trigger event occurs to obtain a first accumulated phase value,
incrementing a second phase value by a second predetermined increment value when the second trigger event occurs to obtain a second accumulated phase value, and
calculating or determining said phase error based on obtained first and second accumulated phase values.

The method of the invention may also comprise the step of frequency dividing the first signal and/or the second signal, whereby the generation of the first and/or second reoccurring trigger event is performed in response to the frequency divided first and/or second signal, respectively.

It is preferred that the calculation or determination of the phase error is based on a subtraction of said second accumulated phase value from said first accumulated phase value.

According to an embodiment of the method of the invention, the first accumulated phase value, the second accumulated phase value and the phase error are represented by binary numbers.

However, it is preferred that the first accumulated phase value and the second accumulated phase value are represented by binary numbers and the phase error is represented by one or more an analogue signals. Here, the method of the invention may further comprise the steps of:
performing a first logic bit by bit AND operation of the first accumulated phase value and the inverted second accumulated phase value, and generating a first analogue representation of said first logic bit by bit AND operation, and
performing a second logic bit by bit AND operation of the second accumulated phase value and the inverted first accumulated phase value, and generating a second analogue representation of said second logic bit by bit AND operation.

According to an embodiment of the invention, the calculation or determination of the phase error may comprise generating one or two analogue phase error signals based on the second analogue representation of the second logic bit by bit AND operation and the first analogue representation of the first logic bit by bit AND operation. Here, the calculation or determination of the phase error may comprise performing an analogue subtraction of the second analogue representation from the first analogue representation.

It is within an embodiment of the method of the invention that the most significant bit of the first accumulated phase value and the most significant bit of the second accumulated phase value are reset when the most significant bit of both said first accumulated phase value and said second accumulated phase value are simultaneously 1 or logic high. It is also within an embodiment that two equal bits of the first and second accumulated phase values are reset whenever these bits are 1 or logic high at the same time.

According to the second aspect of the invention there is also provided a phase comparator for carrying out the method or methods of the second aspect of the invention. Here the first signal is a reference signal and the second signal is an input signal, and the phase comparator comprises:
a first accumulator adapted to add a first predefined phase step value to a first accumulated phase value in response to a reoccurring event in said reference signal,
a second accumulator adapted to add a second predefined phase step value to a second accumulated phase value in response to a reoccurring event in said input signal, and
means or arithmetic means for determining the phase error based on the second accumulated phase value and the first accumulated phase value.

Here, the arithmetic means may comprise subtracting means for determining the phase error by subtracting the second accumulated phase value from the first accumulated phase value.

According to an embodiment of the invention, the phase comparator may include a digital-to-analogue converter adapted to convert the phase error and thereby to generate an analogue output signal.

It is within a preferred embodiment that the phase comparator includes a converter circuit having:
means for performing a first logic bit by bit AND operation of the output of the first accumulator and the inverted output of the second accumulator, and for generating a first analogue representation of said first logic bit by bit AND operation, and means for performing a second logic bit by bit AND operation of the output of the second accumulator and the inverted output of the first accumulator, and for generating a second analogue representation of said second logic bit by bit AND operation. Here, the converter circuit may comprise current mode logic circuits giving a current output for a two bit AND operation, said current output being used for generating an analogue representation for a bit by bit AND operation.

According to an embodiment of the phase comparator of the invention, the arithmetic means may be adapted to obtain one or two analogue phase error signals based on the second analogue representation of the second logic bit by bit AND operation and the first analogue representation of the first logic bit by bit AND operation. Here, the arithmetic means may comprise subtraction means being adapted for performing an analogue subtraction of the second analogue representation from the first analogue representation.

It is also within an embodiment of the phase comparator of the invention that the phase comparator includes a first and a second digital-to-analogue converter adapted to convert the first and the second accumulated phase values and thereby to generate analogue representations thereof. Here, it is preferred that the arithmetic means are adapted to perform an analogue subtraction of the analogue representation of said second accumulated phase value from the analogue representation of said first accumulated phase value.

The second aspect of the invention also includes a phase comparator, wherein the phase comparator includes a first and a second AND-means, where the output of said first AND-means is connected to a first digital-to-analogue converter, whereby a first accumulator is connected to a first non-inverting input of said first AND-means, and whereby a second accumulator is connected to a first inverting input of said first AND-means, the output of said second AND-means being connected to said second digital-to-analogue converter, and that said second accumulator further is connected to a first non-inverting input of said second AND-means, said first accumulator further being connected to a first inverting input of said second AND-means.

The second aspect of the invention also comprises an embodiment of a phase comparator, wherein the phase comparator includes a first reset means for the most significant bit of the first accumulator, a second reset means for the most significant bit of the second accumulator and a third AND-means, where the output of said third AND-means is connected to said first and said second reset means of said first and said second accumulator, where the most significant bit of said first accumulator is connected to a first non-inverting input of said third AND-means, and where the most significant bit of said second accumulator is connected to a second non-inverting input of said third AND-means.

According to a third aspect of the invention there is provided a converter circuit for obtaining an analogue presentation of a digital input signal or of a logical operation on several digital input signals, at least one of the digital input signals having at least 2 bits, said circuit comprising:

a number of current mode logic circuits, CML circuits arranged in modules, with each CML circuit having one or more logic input signals, a first current line, a second current line and a constant current source, each of said CML circuits further comprising means for switching the constant current source between a first conductive state, in which the current source draws or delivers current via the first current line, and a second conductive state, in which the current source draws or delivers current via the second current line, said switching being controlled by at least one of the logic input signals, wherein a first module has at least one CML circuit, with each CML circuit of the first module having a first logic input signal representing the first bit value of a first digital input signal and providing a first control signal for the switching between the first and the second conductive state, and a second module has at least one CML circuit, with each CML circuit of the second module having a first logic input signal representing the second bit value of the first digital input signal and providing a first control signal for the switching between the first and the second conductive state.

According to an embodiment of the converter circuit of the invention, the first digital signal may have N-bits, wherein for each bit k, where k is selected as an integer larger than or equal to zero and smaller than or equal to N−1, there is a corresponding module k having at least one CML circuit, with each CML circuit of the module k having a first logic input signal representing the value of the corresponding bit k of the first digital input signal and providing a first control signal for the switching between the first and the second conductive state.

It is preferred that the current drawn from or delivered to said first current lines of the CML circuits arranged in the modules is used for generating a first analogue output for the converter circuit.

According to an embodiment of the converter circuit, at least part or all of the CML circuits have said logic input signals together with the inverse of said logic input signals as input signals for controlling the switching between the first and the second conductive state.

According to an embodiment of the converter circuit, then for each module k, there is one corresponding CML circuit. Here, the current drawn from or supplied to the first lines of the CML circuits of the modules may be used for generating the first analogue output as a voltage output via a first resistor network or via a first capacitor network.

According to another embodiment of the converter circuit, then for each module k, there are $2^k$ corresponding CML circuits. Here, the sum of the current drawn from or supplied to the first lines of the CML circuits of the modules may be used for generating the first analogue output as a current output.

For the converter circuit of the invention, it is preferred that for the first module, the logic of each CML circuit is designed so that in order for the first logic input signal to control the state of a CML circuit to be in the first conductive state, the first bit of the first digital signal shall be active or logic high. It is also preferred that for the second module, the logic of each CML circuit is designed so that in order for the first logic input signal to control the state of a CML circuit to be in the first conductive state, the second bit of the first digital signal shall be active or logic high.

In general it is preferred that for a converter circuit having a module k, the logic of each CML circuit is designed so that in order for the first logic input signal to control the state of a CML circuit to be in the first conductive state, the corresponding bit k of the first digital signal shall be active or logic high.

According to an embodiment of the third aspect of the invention, a part or all of the CML circuits of said modules may be designed as buffer or inverter circuits having only one logic input signal together with the inverse of said logic signal, said logic signal representing a corresponding bit of the first digital signal.

The CML circuits of the converter circuit of the third aspect of the present invention may be designed to perform different logic functions such as AND, NAND, OR, NOR, XOR or XNOR functions, and the CML circuits may have a number of corresponding logic input signals together with the inverse of such logic signals. When using a complementary CML circuitry, the circuitry used for performing AND, NAND, OR or NOR functions is very much the same, the resulting function being determined by how the input signals and their inverse signals are connected to the switching means of the CML circuit and how the first and second current lines, where the first current line according to embodiments of the invention may represent the logic output, are connected to the switching means of the CML circuitry. Another circuitry may be used for performing the XOR and the XNOR functions, again with the resulting function being determined by how the input signals and their inverse signals are connected to the switching means of the CML circuit and how the first and second current lines are connected to said switching means. Thus, the third aspect of the present invention may also provide a converter for obtaining an analogue presentation of a logical bit-by-bit AND operation on the first digital signal and a second digital signal.

According to an embodiment of the third aspect of the invention, the converter circuit may be designed for obtaining an analogue presentation of a bit by bit logic operation of the first digital signal and a second digital signal, said first and second digital signals having the same number of bits, wherein the CML circuits having a first logic input signal representing the value of a corresponding bit of the first digital signal are designed as first logic operating circuits, each said first logic operating circuit further having as input signal a second logic input signal representing a value of a corresponding bit of the second digital signal, and said second logic input signal providing a second control signal for the switching between the first and the second conductive state. Here, each first logic operating circuit may be designed for performing a logic operation selected between the following logic operations: AND, NAND, OR, NOR, XOR or XNOR.

For the converter circuit designed for a logic bit by bit operation, said first logic operating CML circuits may also have as input signals the inverse signals of the first and second logic input signals.

According to a preferred embodiment of the converter circuit designed for a logic bit by bit operation, the logic of the first logic operating circuits may be designed as first AND operating circuits, said AND operating circuits being designed so that in order for the first and second logic input signals to control the state of a CML circuit to be in the first conductive state, the corresponding bit values of the first digital signal and the second digital signal shall both be active or logic high. Preferably, the switching means of a first AND operating CML circuit may comprise a first switch being controlled by the first logic signal, a second switch being controlled by the inverse of the first logic signal, a third switch being controlled by the second logic signal, and a fourth switch being controlled by the inverse of the second logic signal. The switches may be arranged so that the CML circuit is in the first conductive state drawing or delivering current via the first current line through the first and third switches when the bit values corresponding to the first and second logic signals are both active, and so that the CML circuit is in the second conductive state drawing or delivering current via the second current line through the second and the third switches when the bit value corresponding to the first logic signal is non-active and the bit value corresponding to the second logic signal is active, or through the fourth switch when the bit values corresponding to the first and second logic signals are both non-active.

For the converter circuits designed for a logic bit by bit operation, it is preferred that the first and second logic signals being input to the same first logic operating CML circuit correspond to the same bit number of the first and the second digital signal, respectively.

It should be understood that for the third aspect of the invention then by using the phrase that a signal is active is meant that the signal has a value, which may correspond to a logic high or 1, and by using the phrase that a signal is non-active is meant that the signal has a value, which may correspond to a logic low or zero.

In the above discussion, an AND operating CML circuit according to an embodiment of the present invention has been discussed. However, as already mentioned the present invention also covers logic operations such as NAND, OR, NOR, XOR and XNOR.

When the logic of the first logic operating circuits is designed as first NAND operating circuits, the NAND operating circuits should be designed so that in order for the first and second logic input signals to control the state of a CML circuit to be in the first conductive state, at least one of the corresponding bit values of the first digital signal and the second digital signal shall be non-active.

When the logic of the first logic operating circuits is designed as first OR operating circuits, the OR operating circuits should be designed so that in order for the first and second logic input signals to control the state of a CML circuit to be in the first conductive state, at least one of the corresponding bit values of the first digital signal and the second digital signal shall be active.

When the logic of the first logic operating circuits is designed as first NOR operating circuits, the NOR operating circuits should be designed so that in order for the first and second logic input signals to control the state of a CML circuit to be in the first conductive state, both of the corresponding bit values of the first digital signal and the second digital signal shall be non-active.

When the logic of the first logic operating circuits is designed as first XOR operating circuits, the XOR operating circuits should be designed so that in order for the first and second logic input signals to control the state of a CML circuit to be in the first conductive state, one and only one of the corresponding bit values of the first digital signal and the second digital signal shall be active.

When the logic of the first logic operating circuits is designed as first XNOR operating circuits, the XNOR operating circuits shall be designed so that in order for the first and second logic input signals to control the state of a CML circuit to be in the first conductive state, both of the corresponding bit values of the first digital signal and the second digital signal shall be active or non-active.

According to an embodiment of the converter circuit designed for a logic bit by bit operation, said converter circuit may further be designed for obtaining an analogue presentation of a bit by bit logic operation on a third and a fourth digital signal, said third and fourth digital signals having the same number of bits and having at least 2 bits. Here, the first, second, third and fourth digital signals may have the same number of bits. The converter circuit may further comprise a number of CML circuits being designed as second logic operating circuits, with each second logic operating circuit having at least a first logic input signal representing the value of a corresponding bit of the third digital signal and a second logic input signal representing the value of a corresponding bit of the fourth digital signal, a third current line, a fourth current line and a constant current source, each of said second logic operating circuits further comprising means for switching the constant current source between a first conductive state, in which the current source draws or delivers current via the third current line, and a second conductive state, in which the current source draws or delivers current via the fourth current line, said switching being controlled by at least said first and second logic input signals. It is preferred that the current drawn from or delivered to the first current lines of the first logic operating circuits arranged in the modules is used for generating a first analogue output for the converter circuit, and that the current drawn from or delivered to the third current lines of the second logic operating circuits arranged in the modules is used for generating a second analogue output for the converter circuit.

It should be understood that it is also within the third aspect of the invention that each second logic operating circuit may be designed as a logic operating circuit selected between the following logic operating circuits: AND, NAND, OR, NOR, XOR or XNOR logic operating circuit. It is however preferred that the first and the second logic operating circuits are both designed for performing the same logic operation. It is also within a preferred embodiment that the second logic operating CML circuits further have as input signals the inverse signals of the first and second logic input signals.

According to an embodiment of a converter circuit having second logic operating circuits, the second logic operating circuits may be designed as second AND operating circuits, to thereby obtain an analogue presentation of a bit by bit AND operation of the third and the fourth digital signals. Here, the third and fourth digital signals may have P-bits, wherein for each bit m, where m is selected as an integer larger than or equal to zero and smaller than or equal to P−1, there is a corresponding module m having at least one second AND operating circuit, with each second AND operating circuit of the module m having a first logic input signal representing the value of the corresponding bit m of the third digital signal and providing a first control signal for the switching between the first and the second conductive state, and with each second AND operating circuit of the module m having a second logic input signal representing the value of the corresponding bit m of the fourth digital signal and providing a second control signal for the switching between the first and the second conductive state.

It is within an embodiment of the third aspect of the invention that the logic of said CML circuits being designed as second AND operating circuits is designed so that in order for the first and second logic input signals to control the state of a second AND operating circuit to be in the first conductive state, the corresponding bit values of the third digital signal and the fourth digital signal shall both be active. The switching means of a second AND operating circuit may comprise a first switch being controlled by the first logic signal, a second switch being controlled by the inverse of the first logic signal, a third switch being controlled by the second logic signal, and a fourth switch being controlled by the inverse of the second logic signal. Here, the switches may be arranged so that the second AND operating circuit is in the first conductive state drawing or delivering current via the third current line through the first and third switches when the bit values corresponding to the first and second logic input signals are both active, and so that the second AND operating circuit is in the second conductive state drawing or delivering current via the fourth current line through the second and the third switches when the bit value corresponding to the first logic signal is non-active and the bit value corresponding to the second logic signal is active, or through the fourth switch when the bit values corresponding to the first and second logic input signals are both non-active.

For the converter circuits having second logic operating circuits, the first and second logic signals being input to the same second logic operating circuit may correspond to the same bit number of the third and the fourth digital signals, respectively. It is within an embodiment of the invention that the third and fourth digital signals are the inverse signals of the first and second digital signals, respectively, or the inverse signals of the second or first digital signals, respectively.

For converter circuits having modules with first logic operating circuits and modules with second logic operating circuits, and wherein there for each module k is one corresponding first logic operating circuit, then it is preferred that for each module m, there is one corresponding second logic operating circuit.

For converter circuits having modules with first logic operating circuits and modules with second logic operating circuits, and wherein there for each module k are $2^k$ corresponding first logic operating circuit, then it is preferred that for each module m, there are $2^m$ corresponding second AND operating circuits.

In the above discussion, a second AND operating CML circuit according to an embodiment of the present invention has been discussed. As already mentioned the present invention also covers embodiments in which the second logic operating circuit performs logic operations such as NAND, OR, NOR, XOR and XNOR. Here, the second logic operating circuit may be designed in line with the discussion of the first logic operating circuit, when the first logic operating circuit is designed as a NAND, OR, NOR, XOR or XNOR operating circuit. However, the second logic operating circuits have input signals representing a value of a corresponding bit of the third and fourth digital signals, and the current is delivered or drawn by the constant current source from the third or fourth current lines.

It has been discussed above that the converter circuit of the present invention may comprise first and second logic operating circuits for obtaining an analogue presentation of a bit by bit logic operation of a first and a second digital signal, and an analogue presentation of a bit by bit logic operation of a third and a fourth digital signal.

According to another embodiment of the third aspect of the invention, there is provided a converter circuit being designed for obtaining an analogue presentation of a bit by bit first logic operation on the first digital signal and a second digital signal, and for obtaining an analogue presentation of a bit by bit first logic operation of the inverse signals of the first and second digital signals, said first and second digital signals having the same number of bits. Here, the CML circuits having a first logic input signal representing the value of a corresponding bit of the first digital signal may be designed as combined logic operating circuits, each combined logic operating circuit further having:

a second logic input signal representing a value of a corresponding bit of the second digital signal, and a third current line;

said switching means further being adapted for switching the constant current source between the first conductive state, in which the current source draws or delivers current via the first current line, the second conductive state, in which the current source draws or delivers current via the second current line, and a third conductive state in which the current source draws or delivers current via the third current line; and said first and second logic input signals providing corresponding first and second control signals for the switching between the first, second and third conductive states.

The above described converter circuit design having combined logic operating circuits may have a corresponding design in accordance with an aspect of the present invention, which may also be used for digital input signals having only one bit. Thus, according to a fourth aspect of the present invention there is provided a converter circuit for obtaining an analogue presentation of a bit by bit first logic operation on a first digital signal and a second digital signal, and for obtaining an analogue presentation of a bit by bit first logic operation of the inverse signals of the first and second digital signals, said first and second digital signals having the same number of bits, said circuit comprising:

a number of current mode logic circuits, CML circuits, being designed as combined logic operating circuits, with each combined logic operating circuit having a first logic input signal representing the value of a corresponding bit of the first digital signal and a second logic input signal representing a value of a corresponding bit of the second digital signal, a first current line, a second current line, a third current line and a constant current source, each of said combined logic operating circuits further having means for switching the constant current source between a first conductive state, in which the current source draws or delivers current via the first current line, a second conductive state, in which the current source draws or delivers current via the second current line, and a third conductive state in which the current source draws or delivers current via the third current line; and said first and second logic input signals providing corresponding first and second control signals for the switching between the first, second and third conductive states.

For converter circuits having one or more combined logic operating circuits, it is preferred that the current drawn from or delivered to the first current lines of the combined logic operating circuits arranged in the modules is used for generating a first analogue output for the converter circuit, and that the current drawn from or delivered to the third current lines of the combined logic operating circuits arranged in the modules is used for generating a second analogue output for the converter circuit. The converter circuit may be designed so that the first logic operation is selected between the following logic operations: AND, NAND, OR, NOR, XOR or XNOR logic operating circuit.

It is preferred that each combined logic operating circuit is designed as a combined AND operating circuit, to thereby obtain an analogue presentation of a bit by bit AND operation on the first digital signal and the second digital signal, and for obtaining an analogue presentation of a bit by bit AND operation of the inverse signals of the first and second digital signals.

For converter circuits having one or more combined logic operating circuits, each combined logic operating circuit may further have a third logic input signal representing the inverse value of the bit corresponding to the first digital signal, and a fourth logic input signal representing the inverse value of the bit corresponding to the second digital signal, said third and fourth logic input signals providing corresponding third and fourth control signals for the switching between the first, second and third conductive states.

According to a preferred embodiment of a converter circuit having the combined logic operating circuits designed as AND operating circuits, the logic of the combined AND operating CML circuits is designed so that in order for the logic input signals to control the state of a combined AND operating circuit to be in:

the first conductive state, the corresponding bit values of the first digital signal and the second digital signal shall both be active;

the third conductive state, the corresponding bit values of the first digital signal and the second digital signal shall both be non-active; and the second conductive state, the corresponding bit value of the first digital signal shall be non-active with the corresponding bit value of the second digital signal being active, or the corresponding bit value of the first digital signal shall be active with the corresponding bit value of the second digital signal being non-active.

For converter circuits having one or more combined logic operating circuits, it is preferred that the first and second logic input signals correspond to the same bit number of the first and second digital signals, respectively.

According to an embodiment of the converter circuits having one or more combined logic operating circuits, the switching means of the combined AND operating circuit comprises a first switch being controlled by the first logic signal, a second switch being controlled by the third logic signal or the inverse of the first logic signal, a third switch being controlled by the second logic signal, a fourth switch being controlled by the fourth logic signal or the inverse of the second logic signal, a fifth switch being controlled by the third logic signal of the inverse of the first logic signal, and a sixth switch being controlled by the first logic signal. Here, the switches may be arranged so that the combined AND operating circuit is in:

the first conductive state drawing or delivering current via the first current line through the first and third switches when the bit values corresponding to the first and second logic signals are both active;

the third conductive state drawing or delivering current via the third current line through the fifth and fourth switches when the bit values corresponding to the first and second logic signals are both non-active;

the second conductive state drawing or delivering current via the second current line through the third and second switches when the bit value corresponding to the first logic signal is non-active and the bit value corresponding to the second logic signal is active; and the second conductive state drawing or delivering current via the second current line through the sixth and fourth switches when the bit value corresponding to the first logic signal is active and the bit value corresponding to the second logic signal is non-active.

In the above discussed embodiments of the third and fourth aspects of the invention, examples have been given on a converter circuit being designed for obtaining an analogue presentation of a bit by bit first logic operation of a first and a second digital signal, and for obtaining an analogue presentation of a bit by bit first logic operation of the inverse signals of the first and second digital signals. Also here, when using a complementary logic having both the truth and the inverse values of a signal as input to the logic circuit, the circuitry used for performing first logic operations being AND, NAND, OR or NOR functions is very much the same, the resulting function being determined by how the input signals and their inverse signals and the first, second and third current lines are all connected to the switching means of the CML circuit. Here, the current in the first current line according to embodiments of the invention may be used for the first analogue output and the current in the third current line may be used for the second analogue output. Another circuitry may be used for the first logic operations to perform XOR and XNOR functions, again with the resulting function being determined by how the input signals and their inverse signals are connected to the switching means of the CML circuit and how the first, second and third current lines are connected to said switching means.

It should be understood that for the herein described bit by bit first logic operations of the first and second digital signals and the inverse of these signals, then if it is desired to use a signal being the inverse of the second signal, then a bit by bit first logic operation of the first signal and the inverse of the second signal can be obtained, when using complementary logic by shifting the truth logic input signals of the second signal from the truth to the inverse signals, and by shifting the inverse logic input signals of the second signal from the inverse to the truth signal.

It is preferred that for the converter circuits of the third and fourth aspects of the invention, the number of CML circuits are being powered by the same power supply having a positive supply terminal and a negative or ground terminal. It is also preferred that the constant current sources of each of the CML circuits of said modules or each of the CML circuits are designed to draw or deliver substantially the same current.

For a converter circuit according to the third or fourth aspect of the invention having modules with CML circuits, and wherein for each module corresponding to bit k there are $2^k$ corresponding CML circuits having a first current line and a second current line, it is preferred that each said first current line is supplied from the same, first supply line. Here, the current drawn from or delivered to said first supply line by the first current lines may represent a first analogue output signal for the converter circuit.

For a converter circuit according to the third or fourth aspect of the invention having modules with combined logic operating CML circuits, and wherein for each module corresponding to bit k there are $2^k$ corresponding combined logic operating circuits having a first current line, a second current line and a third current line, it is preferred that each said first current line is supplied from the same, first supply line, and each said third current line is supplied from the same, third supply line. Here, the current drawn from or delivered to said first supply line by the first current lines may represent a first analogue output signal for the converter circuit, and the current drawn from or delivered to said third supply line by the third current lines may represent a second analogue output signal for the converter circuit.

For a converter circuit according to the third aspect of the invention having modules with second logic operating CML circuits, and wherein for each module corresponding to bit m there are $2^m$ corresponding CML circuits having a third current line and a fourth current line, it is preferred that each said third current line is supplied from the same, third supply line. Here, the current drawn from or delivered to said third supply line by the third current lines may represent a second analogue output signal for the converter circuit.

For a converter circuit according to the third or fourth aspect of the invention having modules with CML circuits, and wherein for each module corresponding to bit k there is one corresponding CML circuit having a first current line and a second current line, it is preferred that each said first current line is supplied from the same power supply via a first resistor network or via a first capacitor network having a first voltage output representing a first analogue output signal for the converter circuit.

For a converter circuit according to the third or fourth aspect of the invention having modules with combined logic operating CML circuits, and wherein for each module corresponding to bit k there is one corresponding combined logic operating circuit having a first current line, a second current line and a third current line, it is preferred that each said first current line is supplied from the same power supply via a first resistor network or via a first capacitor network having a first voltage output representing a first analogue output signal for the converter circuit, and that each said third current line is supplied from said power supply via a second resistor network or via a second capacitor network having a second voltage output representing a second analogue output signal for the converter circuit.

For a converter circuit according to the third aspect of the invention having modules with second logic operating CML circuits, and wherein for each module corresponding to bit m there is one corresponding CML circuit having a third current line and a fourth current line, it is preferred that each said third current line is supplied from the same power supply via a second resistor network or via a second capacitor network having a second voltage output representing a second analogue output signal for the converter circuit.

For a converter circuit according to the third or fourth aspect of the invention having a first resistor network, it is preferred that the first resistor network is formed as a first R-2R network having the first voltage output. For a converter circuit according to the third or fourth aspect of the invention having a second resistor network, it is preferred that the second resistor network is formed as a second R-2R network having the second voltage output.

According to an embodiment of the third or fourth aspect of the invention, the second current lines of the CML circuits are powered by the positive terminal of a common power supply or via a resistor connected to the positive terminal of the power supply. For converter circuits having second logic operating circuits, it is preferred that the fourth current lines of the second logic operating CML circuits are powered by the positive terminal of the power supply or via a resistor connected to the positive terminal of the power supply. Preferably, the second current lines and the fourth current lines of the CML circuits are powered from the same supply line.

According to an embodiment of the third or fourth aspect of the invention, the constant current sources of the CML circuits are delivering current to the negative or ground terminal of a common power supply.

According to a preferred embodiment of the third or fourth aspect of the invention, the switching means of the CML circuits is made using N-MOS technology. However, the present invention also covers converter circuits wherein the switching means of the CML circuits is made using P-MOS technology or other technologies, in which it is possible to implement a switch function e.q. (Bipoar, METFET etc.)

It should be understood that some of the embodiments of the converter circuits of the third and fourth aspects of the present invention may be used for the phase comparator according to the first and second aspects of the invention.

Thus, the present invention also covers a phase-locked loop according to the first aspect of the invention and having a phase comparator including a converter circuit, and the present invention further covers a phase comparator according to the second aspect of the invention including a converter circuit, wherein the converter circuit of the phase comparator comprises first AND operating circuits and second AND operating circuits for performing said first and second logic bit by bit operation, respectively, said first and second AND operating circuits being selected from converter circuits of the third aspect of the invention having both first and second AND operating circuits. Here, the output of the first accumulator is the first digital signal, the inverted output of the second accumulator is the second digital signal, the inverted output of the first accumulator is the third digital signal, and the output of the second accumulator is the fourth digital signal.

The present invention also covers a phase-locked loop according to the first aspect of the invention having a phase comparator including a converter circuit, and the present invention further covers a phase comparator according to the second aspect of the invention including a converter circuit, wherein the converter circuit of the phase comparator comprises combined AND operating circuits for performing said first and second logic bit by bit operation, said combined AND operating circuits being selected from converter circuits of the third or fourth aspect of the invention having combined AND operating circuits. Here, the output of the first accumulator is the first digital signal, and the inverted output of the second accumulator is the second digital signal.

In a conventional phase-locked loop as shown in FIG. 1, the output signal of the VCO 101 is divided by integers $N_F$ and $N_R$, while the reference clock signal is divided by the integer $N_V$, to thereby obtain that the phase comparator receives two signals having the same frequency.

I is also possible to obtain input signals for the phase comparator having the same frequency, if the reference clock signal is multiplied by an integer $N_V$, and the output signal divided by $N_F$ is further multiplied by an integer $N_V$. This is illustrated in FIG. 5 and is used for the design of the phase-locked loop of the present invention.

According to the present invention the multiplication of the reference signal or clock by $N_R$ is obtained by accumulating a first predefined phase step $N_R$ to a first accumulated phase value in response to the frequency of the reference signal, and the multiplication of the VCO signal or the divided VCO signal by $N_V$ is obtained by accumulating a second predefined phase step $N_V$ to a second accumulated phase value in response to the frequency of the obtained VCO signal.

However, the analysis used for the conventional phase-locked loop and the phase-locked loop of the present invention is the same and is giving in the following.

Constructing a phase-locked loop of the present invention as described above have a number of benefits. These benefits may most easily be seen from an analysis of the circuit function. Starting with analysing the above mentioned phase-locked loop in an ideal non-digital case, the phase versus time of the output signal and the reference signal may be represented as $$\phi_R(t) = \omega_R t + \phi_{R0}$$

$$\phi_V(t) = \omega_V t + \phi_{V0} \qquad [1]$$

where index R Is the reference and index V is the variable frequency.

The period time $T_R$ and $T_V$ of the signal may be calculated as $$T_R = \frac{2\pi}{\omega_R} \quad \text{and} \quad T_V = \frac{2\pi}{\omega_V} \qquad [2]$$

The fractional relationship between $T_R$ and $T_V$ as $T_R = N_R \Delta t, \quad \tfrac{1}{2} N_R \in N$ $T_V = N_V \Delta t, \quad \tfrac{1}{2} N^V \in N \qquad [3]$ where $N_R$ and $N_V$ are the predetermined phase step values corresponding to the integer numbers by which the frequencies are multiplied.

From [1], [2] and [3] the following relation may be defined as $$N_R \phi_R(t) = \frac{2\pi}{N_R \Delta t} N_R t + N_R \phi_{R0} \qquad [4]$$

$$N_V \phi_V(t) = \frac{2\pi}{N_V \Delta t} N_V t + N_V \phi_{V0}$$

The phase error may be defined as $$2\pi \cdot e(t) = \epsilon(t) = N_R \phi_R(t) - N_V \phi_V(t) \qquad [5]$$

If the relations in [3] and [4] are fulfilled, the slope of the phase functions may be derived as $N_R \Phi_R(t)$ and $N_V \Phi_V(t)$, where both of the slopes are equal to $K_\Phi = 2\pi/\Delta t$. This leads to the following error relation $$\epsilon(t)\Big|_{\frac{\omega_R}{\omega_V} = \frac{N_V}{N_R}} = N_R \phi_{R0} - N_V \phi_{V0} \qquad [6]$$

This means that the phase error function is equal to the traditional PLL when $\omega_R/\omega_V = N_V/N_R$. When $N_R = N_V$, the phase error is exactly the same as a traditional PLL. Laplace transforming [4], the spectral domain becomes $$\mathcal{P}_R(s) = \mathcal{L}\left\{\frac{N_R}{2\pi} \phi_R(t)\right\} = \frac{N_R \omega_R}{2\pi s^2} + \frac{N_R}{2\pi} \phi_R = \frac{N_R}{T_R s^2} + \frac{N_R}{2\pi} \phi_R \qquad [7]$$

$$\mathcal{P}_V(s) = \mathcal{L}\left\{\frac{N_V}{2\pi} \phi_V(t)\right\} = \frac{N_V \omega_V}{2\pi s^2} + \frac{N_V}{2\pi} \phi_V = \frac{N_V}{T_V s^2} + \frac{N_V}{2\pi} \phi_V$$

In the ideal case, the phase function of the PLL is a straight line with a slope. In the digital implementation of a PLL, the phase function becomes a staircase function. This corresponds to an error function between the straight line and the staircase which is a sawtooth function. From [4] the staircase phase function may be defined as $$R(t)\Big|_{t=T_R i} = \frac{N_R}{2\pi} \phi_R(t)\Big|_{t=T_R i} \quad i \in \mathcal{N}^0 \qquad [8]$$

$$V(t)\Big|_{t=T_V i} = \frac{N_V}{2\pi} \phi_V(t)\Big|_{t=T_V i} \quad j \in \mathcal{N}^0$$

which in the continuous time domain gives the staircase phase function as $$R(t)\Big|_{t \in ]T_R i - \frac{T_R}{2} ; T_R(i+1) \frac{T_R}{2}]} = \left(\frac{N_R}{T_R} \Delta t\right) i + \frac{N_R}{2} + N_R \frac{\phi_{R0}}{2\pi} \quad i \in N^0 \qquad [9]$$

$$V(t)\Big|_{t \in ]T_V j - \frac{T_V}{2} ; T_V(j+1) \frac{T_V}{2}]} = \left(\frac{N_V}{T_V} \Delta t\right) j + \frac{N_V}{2} + N_V \frac{\phi_{V0}}{2\pi} \quad j \in N^0$$

and which in the spectral domain may be written as $$\mathcal{L}\{R(t)\} = \mathcal{R}(s) = \frac{N_R}{s(1 - e^{-T_R s})} e^{-\frac{T_R}{2} s} + \frac{N_R}{2} + \frac{N_R}{2\pi} \phi_{R0} \qquad [10]$$

$$\mathcal{L}\{V(t)\} = \mathcal{V}(s) = \frac{N_V}{s(1 - e^{-T_V s})} e^{-\frac{T_R}{2} s} + \frac{N_V}{2} + \frac{N_V}{2\pi} \phi_{V0}$$

-continued $$\mathcal{R}(s) = \left\{ \frac{N_R}{s(1-e^{-T_R s})} e^{-\frac{T_R}{2}s} - \frac{N_R}{T_R s^2} + \frac{N_R}{2} \right\} + \frac{N_R}{T_R s^2} + \frac{N_R}{2\pi} \phi_{RO} \qquad [11]$$

$$\mathcal{V}(s) = \left\{ \frac{N_V}{s(1-e^{-T_V s})} e^{-\frac{T_V}{2}s} - \frac{N_V}{T_V s^2} + \frac{N_V}{2} \right\} + \frac{N_V}{T_V s^2} + \frac{N_V}{2\pi} \phi_{VO}$$

From [7] and [11] the following relation may be defined as $$R(s) = S_R(s) + P_R(s)$$

$$V(s) = S_V(s) + P_V(s) \qquad [12]$$

From [11] and [12] the time domain functions for $S_R$ and $S_V$ may be derived as $$S_R(t)|_{t \geq 0} = \mathcal{L}^{-1}\{S_R(s)\} = -\frac{N_R}{\pi} \sum_{k \in \mathcal{N}^0} (-1)^k \frac{\sin((2k+1)\omega_{S_R} t)}{2k+1} \qquad [13]$$

$$S_V(t)|_{t \geq 0} = \mathcal{L}^{-1}\{S_V(s)\} = -\frac{N_V}{\pi} \sum_{k \in \mathcal{N}^0} (-1)^k \frac{\sin((2k+1)\omega_V t)}{2k+1}$$

The phase error function from [5] may be derived in a similar manner as $$E(t) = R(t) - V(t) = e(t) + S_R(t) - S_V(t) \qquad [14]$$

where the only difference between the two functions is the sawtooth function given by [13], which in the spectral domain becomes $$\epsilon(s) = R(s) - V(s) \qquad [15]$$

Analysing the staircase error function, it appears that there are no spectral harmonics below $\omega_R$ or $\omega_V$. This means that there are no sub-harmonics of the reference signal nor the variable signal.

From the above the selected output frequency becomes a function of the reference frequency and the integers by which the frequencies are multiplied as $$f_o = (N_R/N_V) N_F f_R \qquad [16]$$

According to [13] the generated spurious may be selected to be as far apart as desired by selecting the two integers $N_R$ and $N_V$ appropriately, because it is their ratio that selects the output frequency. Also, according to [13], the amplitude of the spurious decreases the further away from the base frequency they are. This provides a large loop-bandwidth, which means a fast lock-in time. It is therefore both possible to select the bandwidth of the loop and how closely the spurious are placed, thereby producing a component which is more like the ideal phase-locked loop, without some of the disadvantages due to the way the component is constructed. The phase-locked loop is also easily constructed with standard "of-the-shelf" components.

Other features and advantages of the method of the present invention will become apparent from the following description of preferred embodiments, taken in conjunction with the accompanying drawings.

DESCRIPTION OF PREFERRED EMBODIMENTS

In the figures are all lines with a small line across representing a binary number.

Figure 1:
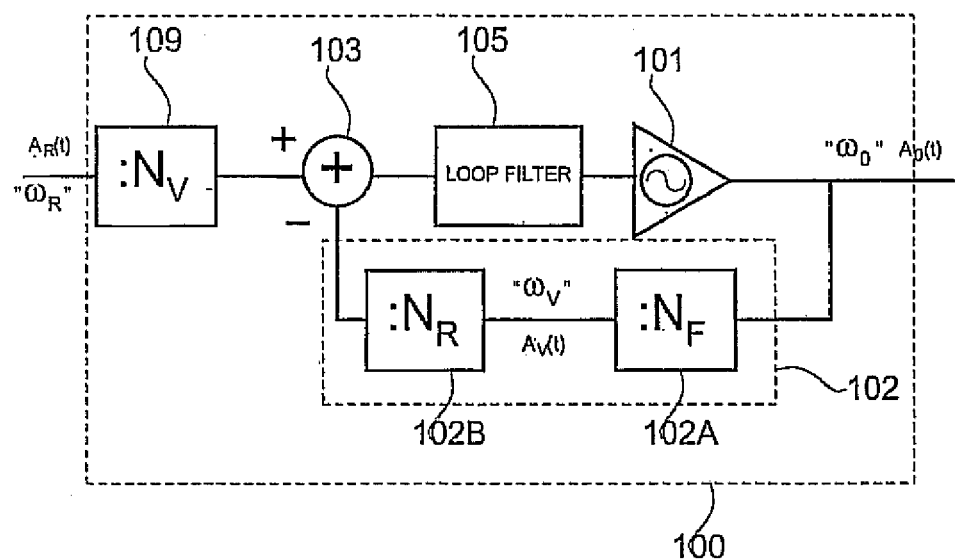
FIG. 1 is an example of a phase-locked loop according to the prior art.

FIG. 1 is an example of a phase-locked loop according to the prior art. The phase-locked loop 100 includes a voltage controlled oscillator 101, a frequency divider 102, and a phase comparator 103. The voltage controlled oscillator or VCO 101 includes a frequency controlling input terminal and an output terminal. As shown in FIG. 1, the output terminal of the VCO 101 is operatively connected to an input terminal of the frequency divider 102. Further, the frequency divider 102 includes an output terminal which is operatively connected to a first input terminal of the phase comparator 103. The phase comparator 103, which is also denoted a phase detector 103 in the following, also includes a second Input terminal and an output terminal. The output terminal of the phase detector 103 is operatively connected to the input terminal of the VCO 101. Hereby the voltage controlled oscillator 101, the frequency divider 102, and the phase comparator 103 form a closed loop.

The voltage controlled oscillator or VCO 101 is adapted for retrieving an control signal via the input terminal of the VCO and for generating an oscillating electrical output signal having a frequency which is determined by the control signal. The frequency divider 102 is adapted for dividing the frequency of a signal supplied thereto, i.e. the output signal of the VCO 101, and hereby generating a signal having a reduced frequency compared to the frequency of the input signal supplied thereto.

The phase comparator 103 is adapted for deriving a control signal from the frequency-divided output signal and a reference signal supplied thereto via the first and the second input terminal, respectively. Hereby, when the phase comparator 103 is supplied by the frequency-divided output signal from the VCO 101 and the reference signal, an output signal reflecting the phase error between the two input signals is generated. For example, the phase comparator may output a voltage proportional to the phase difference between the input signals. As mentioned above, the phase comparator 103 is coupled to the voltage controlled oscillator 101, i.e. during operation the control signal generated by the phase comparator 103 is supplied to the VCO 101 via the frequency control input terminal of said voltage controlled oscillator.

The shown phase-locked loop also includes a loop filter 105 adapted for smoothening the output of phase detector 103, i.e. filtering the signal used to control the voltage controlled oscillator 101 and hereby reducing unwanted spurious occurring in the signal. Further, as illustrated in FIG. 1, the frequency divider 102 may include one or more frequency dividing parts 102A, 102B. Hereby, a first frequency dividing part 102A and a second frequency dividing part 102B may be adapted for performing the frequency division in two successive steps. In addition, the reference signal may also be derived from another signal, e.g. the reference signal may be an output signal of a frequency divider 109 as shown in FIG. 1.

In short the operation of a phase-locked loop may be explained as follows. During operation the frequency divider 102 receives an oscillating input signal from the VCO and generates an oscillating signal having a reduced frequency. The phase detector 103 outputs a signal, which is determined by the phase difference between the two input signals supplied thereto, ie. the phase difference between the output signal of the frequency divider 102 and the reference signal. When the phase of the output signal from the frequency divider 102 lags behind of the phase of the reference signal, the phase detector outputs an "up" signal, e.g. by increasing the output voltage which is supplied to the VCO 101 via the loop filter 105. On the other hand, when the phase of the output signal from the frequency divider 102 leads that of the reference signal, the phase detector outputs a "down" signal, e.g. by decreasing the output voltage which is supplied to the VCO 101 via the loop filter 105. The voltage controlled oscillator 101 outputs an oscillating signal determined by the output voltage from the loop filter 105. Hereby, the frequency of the VCO output signal increases and decreases when the phase detector 103 outputs an "up" and a "down" signal, respectively. As a result the phase difference between output signal of the frequency divider 102 and the reference signal is decreased. When the phase-locked loop 100 is in a phase-locked state, the phase of the output signal of the frequency divider 102 is in alignment with that of the reference signal and the frequency of the two signals are the same. There are therefor three signals of importance in the phase-locked loop: $A_O$, $A_V$ and $A_R$, which are cyclic functions and may be described as $$A_O(t)=\sin(\omega_0 t+\phi_0)$$

$$A_R(t)=\sin(\omega_R t+\phi_{R0})=\sin(\phi_R(t))$$

$$A_V(t)=\sin(\omega_V t+\phi_{V0})=\sin(\phi_V(t)) \quad [17]$$

When the system is in lock the following condition is fulfilled $$\omega_D = \frac{\omega_R}{N_V} = \frac{\omega_V}{N_R} = \frac{\omega_0}{N_R \cdot N_F} \quad [18]$$

which gives a phase error $$\phi_D(t) = \frac{\phi_R(t)}{N_V} - \frac{\phi_V(t)}{N_R} \quad [19]$$

The effective angle frequency by which the phase comparator operates is that which corresponds to $\omega_D$. This will lead to the generation of spurious, because this angle frequency is slower than $\omega_0$. The spurious are unwanted, because they will cause unwanted channels to interfere and must be filtered out by a filter placed in the loop. However, this reduces the bandwidth of the phase-locked loop.

Example of a conventional PLL:

Here we want to design a channel selector by using a traditional PLL structure with channels from 2400 MHz to 2480 MHz and with a channel step of 1 MHz.

The maximum angle frequency is $\omega_D=2\pi 1$ MHz, and because of this we are limited to chose the reference frequency to an integer number $N_V$ times 1 MHz.

We can chose $N_V=19$ this means that the reference frequency is 19 MHz.

We set $N_F=1$. The channel can be selected by changing the value of $N_R$ from 2400, 2401, 2402 until 2480.

Example of a PLL according to the present invention:

Here we chose to divide the output of the VCO with the integer number $N_F=32$ because it is easy to implement a high speed divide by 32 in hardware, and we have a given reference frequency of $f_R=18.6$ MHz. We can from this calculate the relation between the predetermined phase values $N_V$ and $N_R$ from equation [16]. Here $N_R$ is first predetermined phase step value used for the reference signal and $N_V$ is the second predetermined phase value used for divided output signal.

We want channels from 2400 MHz to 2480 MHz with channel steps of 1 MHz. So by setting the output frequency $f_O=(2400+M)$ MHz, where M is the channel number, we obtain from equation [16] (2400+M) MHz=$(N_R/N_V)N_F f_R$.

From here we can the chose the relation between $N_V$ and $N_R$, and for $N_V=2976$, we get that $N_R=12000+5M$.

Figure 2:
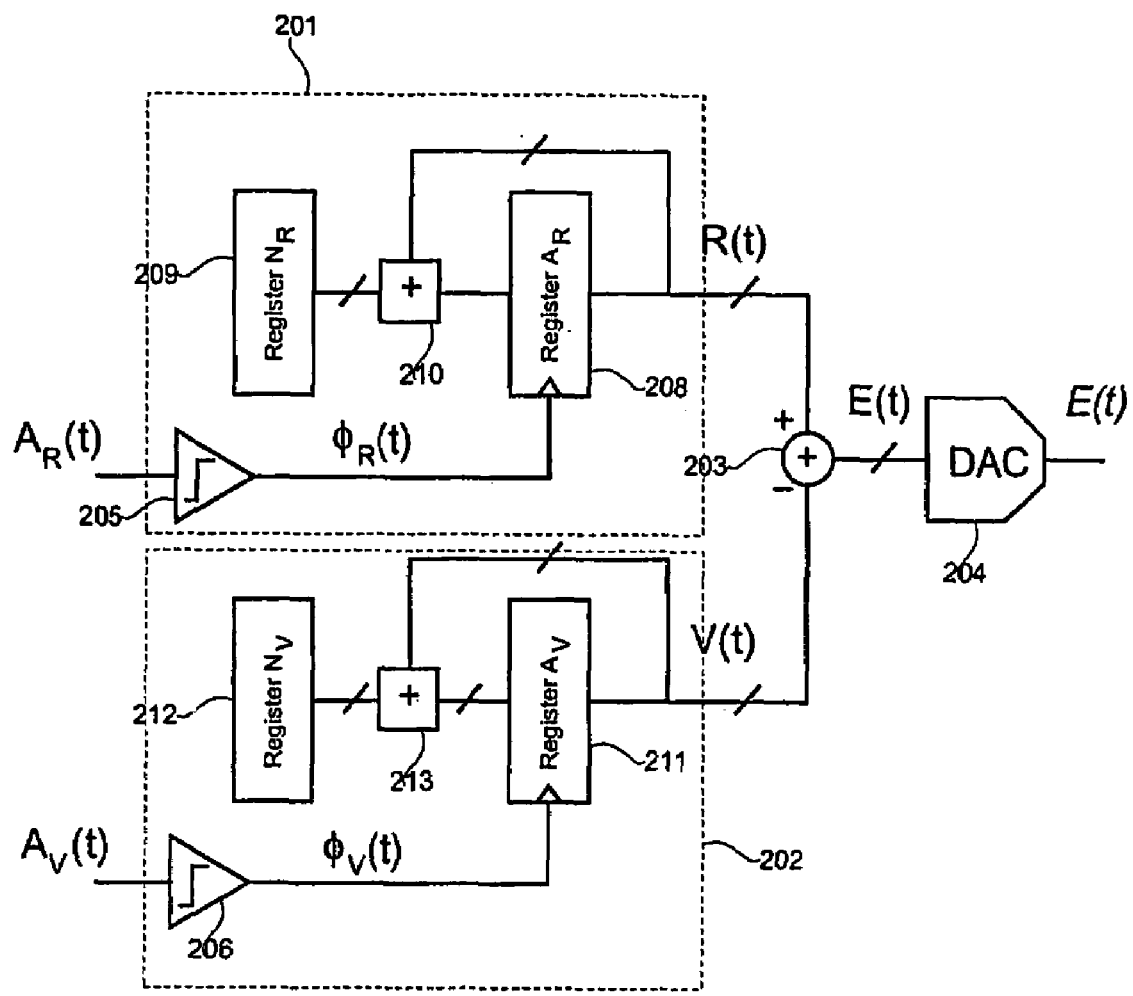
FIG. 2 is a first embodiment of a phase comparator or frequency comparator according to the invention.

FIG. 2 illustrates a first embodiment of a phase comparator or frequency comparator according to the invention. The phase comparator includes a first accumulator 201, a second accumulator 202 and subtracting means 203. The first accumulator 201 and the second accumulator 202 both include an input terminal and an output terminal. The first and the second accumulator 201, 202 are operatively connected to a first and a second input terminal of the subtracting means 203. The first and the second accumulator 201, 202 are both adapted for receiving an input signal via the input terminal and generating an output signal, which is supplied to the subtracting means. Responsive to the input signal received via the input terminal of the accumulator 201, the first accumulator 201 is adapted for accumulating a first value in a register or memory thereof. Likewise, responsive to the input signal received via the input terminal of the accumulator 202, the second accumulator 202 is adapted for accumulating a second value in a register or memory thereof. The phase comparator is adapted for supplying the first and the second accumulated values to the subtraction means 203 and thereby the difference there between may be determined. When the first and the second accumulator 201, 202 are adapted for being triggered by trigger signals reflecting the phase of a first and a second signal, respectively, the difference between the accumulated values reflects the phase difference between the first and the second signal.

In the shown embodiment, the first accumulator 201 includes a first digital register 208, a second digital register 209, a first adder 210 and a first trigger 205. The first adder 201 is adapted for being supplied with the contents of the two registers 208, 209 or at least a subset thereof, e.g. a number of the least significant bits, as input values. The first adder 210 is adapted for adding the values supplied as input and hereby generating a digital output signal. The output of the adder 210 is connected to the input of the first register 208 which is adapted for being trigged by a trigger signal supplied thereto via the first trigger 205 connected thereto. When the first register 208 is trigged, the input value supplied thereto by the adder 210 written into the first register 208 and hereby saved as the new updated content thereof. For simplicity, in the shown embodiment the contents of the registers 208 and 209 are continuously present at the output terminals. As a result the output of the first adder 210 is present at the input terminal of the register 208 and therefore the content is updated when the register 208 is trigged by trigger means 205.

When the second register 209 holds a predefined phase step value, the first register 208 includes a first accumulated phase value, which is updated when trigged. A first oscillating signal $A_R(t)$, e.g. a reference signal, may be supplied as input to the first trigger means 205 and hereby the first trigger means 205 forms a trigger signal which is supplied to the first register 208. As indicated in FIG. 2, the first trigger means 205 is adapted for trigging the first register 208 when a first input signal supplied thereto exceeds a first predetermined level, i.e. the first accumulator 201 is adapted for, responsive to a reoccurring event in a first oscillating signal supplied thereto, adding a first predefined phase step value to a first accumulated phase value.

In the shown embodiment, the second accumulator 202 is implemented similarly to the above-mentioned implementation of the first accumulator 201, and includes two registers 211, 212, a second adder 213, and a second trigger 206. The output of the second trigger 206 is connected to a trigger input of a first of the two registers. A second oscillating signal $A_V(t)$, e.g. a frequency-divided version of an voltage controlled oscillator output signal, may be supplied as an input to the second trigger 206. As indicated, the second trigger 206 is adapted for trigging the first of the two registers 211 when a second input signal supplied thereto exceeds a second predetermined signal level, i.e. the second accumulator 202 is adapted for, responsive to a reoccurring event in the second oscillating signal supplied thereto, adding a second predefined phase step value to a second accumulated phase value. When the first of the two registers is trigged the output of the second adder 213, i.e. the sum of the contents of the two registers 211, 212, is stored as the new content of the register 211.

When a first and a second oscillating signal are supplied to the first and the second trigger means 205, 206, respectively, and when the second and the fourth registers 209, 212 are given value representing predefined phase steps, the outputs of the first and the second accumulator are accumulated phase values reflecting the phase of the first and the second oscillating signal, respectively. The subtracting means 203 is adapted for subtracting the first accumulated phase value and the second accumulated phase value and hereby determining the phase error between the first and the second signal supplied to the trigger means 205, 206. As illustrated in FIG. 2, the output of the subtracting means 203 is connected to a digital-to-analogue converter 204 adapted for converting the digital representation of the phase error to an analogue value and hereby forming and analogue output signal of the phase comparator.

The above-mentioned embodiment is advantageous due to the simplicity, which is obtained due to the calculation of the phase error as a digital subtraction. The price, on the other hand, is that the digital subtraction may generate spikes and hazards in the resulting phase error signal. In the following a second embodiment of a phase comparator according to the invention is described. This embodiment is an example of a phase comparator which is both simple and hereby easy to implement, and in which spikes and hazards do not occur in the resulting output signal.

Figure 3:
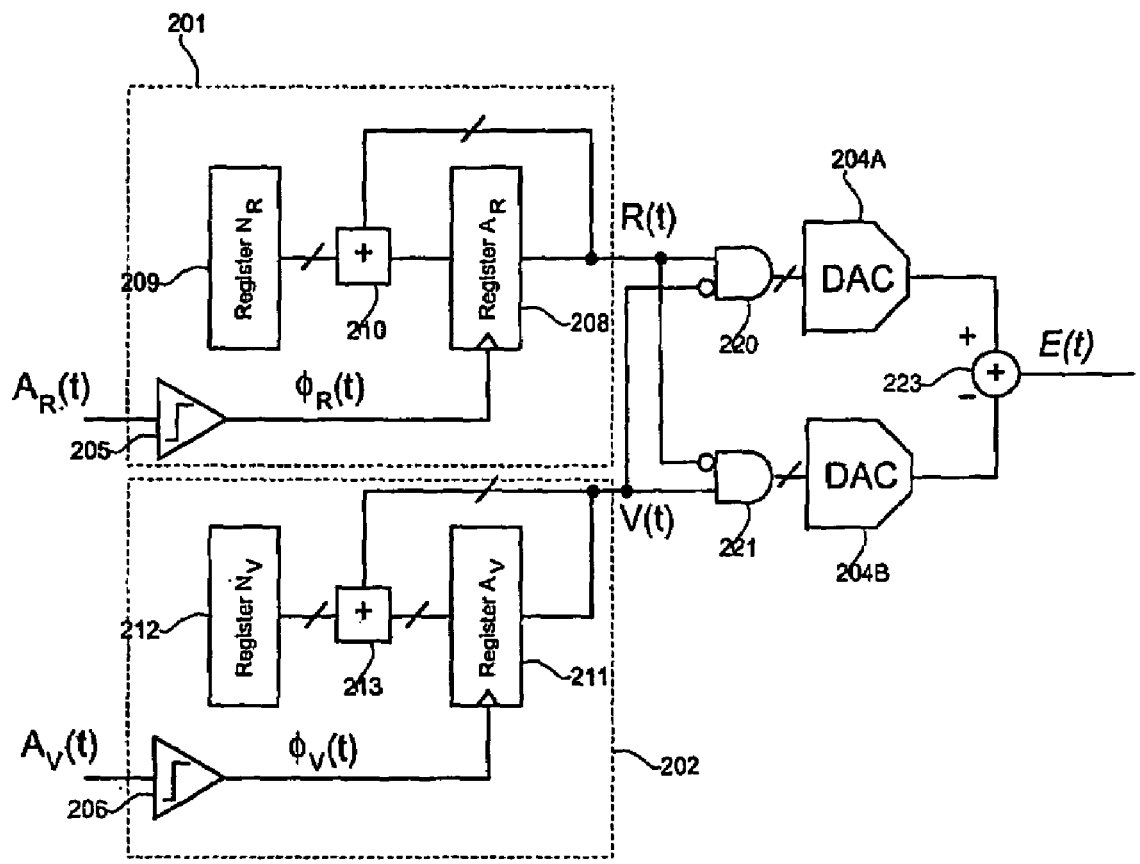
FIG. 3 is a second embodiment of a phase comparator or frequency comparator according to the invention.

FIG. 3 illustrates a second embodiment of a phase comparator according to the invention. In this embodiment, the first and the second accumulator 201, 202 is implemented as described in relation to FIG. 2. Therefore the first and the second accumulator 201, 202 and the function thereof will not be described further below.

In contrast to the embodiment shown in FIG. 2, the output of the first and the second accumulators 201, 202 in the embodiment shown in FIG. 3 are connected to a first and a second digital-to-analogue converter 204A, 204B, respectively. Hereby, when a digital value representing an accumulated phase value is supplied the first and the second digital-to-analogue converter 204A, 204B, respectively, an analogue representation thereof is formed. The output of the first and second digital-to-analogue converter 204A, 204B are connected to a subtraction means 223 which is adapted for performing an analogue subtraction and hereby forming an analogue output signal of the phase comparator.

Optionally the phase comparator may include a first and a second AND-gate 220, 221 as illustrated in FIG. 3. In the shown embodiment, the output of the first accumulator 201 and the second accumulator 202 is connected to a non-inverted and an inverted input of the first AND-gate 220, respectively. Further, the output of the first accumulator 201 and the second accumulator 202 is connected to an inverted and a non-inverted input of the second AND-gate 221, respectively. As illustrated in FIG. 3, the AND-gates 220, 221 are adapted for performing a bit-by-bit AND operation on the digital signals supplied thereto.

Using AND-gates as described above, the subtraction of the two digital numbers is pre-processed. By further digital-to-analogue converting the digital numbers with the two digital-to-analogue converters 204A, 204B and performing the subtraction by using analogue subtraction means 223, the risk of ripples are significantly minimised.

The analogue subtraction means in the above-mentioned phase comparator is advantageous as no spikes or hazards will occur in the resulting output signal due to short lived error signals on the higher bits. Therefore, this embodiment has been found very useful.

The two adding means 210 and 213 does not contribute to a similar problem as described above. This is because the output from the two adding means 210 and 213 are only read into said first digital register 208 and said second digital register 209 when they are triggered by said first trigger 205 or said second trigger 206. The outputs from said two adding means 210 and 213 therefore have adequate time to settle to stable outputs.

Figure 4:
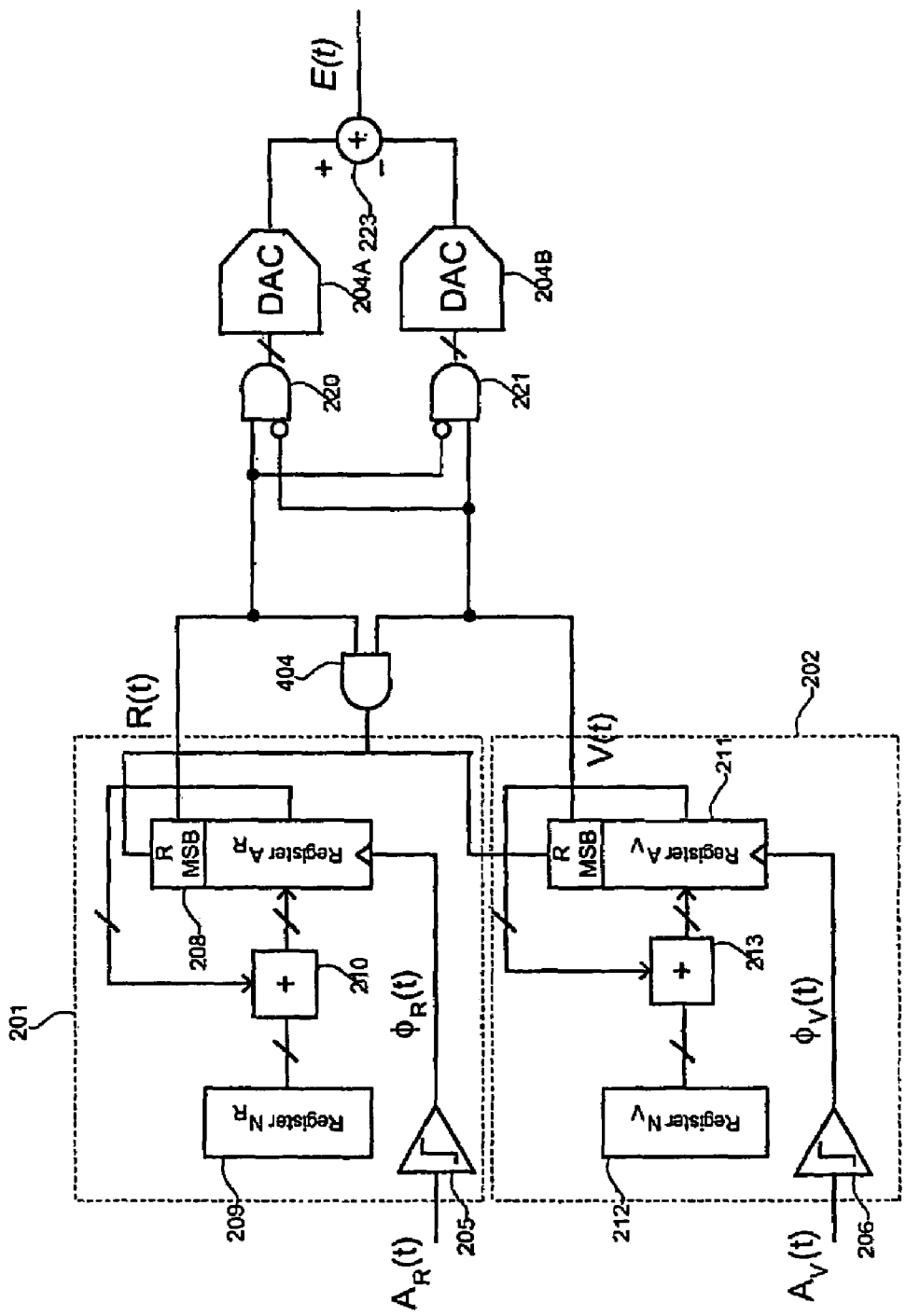
FIG. 4 is a third embodiment of a phase comparator or frequency comparator according to the invention.

FIG. 4 illustrates a third embodiment of a phase comparator according to the invention. The shown embodiment includes a synchronous reset of the most significant bit (MSB) of the first register 208 and the third register 211, i.e. the registers adapted for including accumulated values. It is, however, not the absolute value of the digital number in the registers, but the difference between the numbers. The synchronous reset may be implemented as illustrated in FIG. 4. In the shown embodiment the first register 208 and the third register 211 have the same length, i.e. the two registers include the same number of bits. When the phase comparator is in use the contents of the two registers are accumulated as a result of the above-mentioned trigger signal supplied thereto. As the difference between the contents of the two registers is calculated, it has to be insured that a possible overflow of the registers is taken care of. This is due to the fact that an uncontrolled overflow may otherwise lead to an undesired result when performing the subsequent subtraction. To overcome this problem an AND-gate 404 is connected to the first and the third register 208, 211. The AND-gate 404 is adapted for being supplied with the most significant bit (MSB) of the first register 208 and the third register 211 as shown in FIG. 4. The output of the AND-gate 404 is connected to a reset input of both the first register 208 and the third register 211. Hereby, when the most significant bit of both the first and the third register 208, 211 is "1", i.e. the MSB equals a value of logical "1", the output value of the AND-gate 404 is also "1". In all other situations, the output value of the AND-gate 404 is "0". Therefore the most significant bit of the first and the third register is reset, i.e. set to "0", when they have both become "1". Hereby, an overflow is avoided in such a manner that the output signal of the phase comparator continuously reflects the phase difference between the two input signals supplied thereto. Optionally, a similar reset may be implemented for not only MSB, but for any bit of the digital number.

Figure 5A:
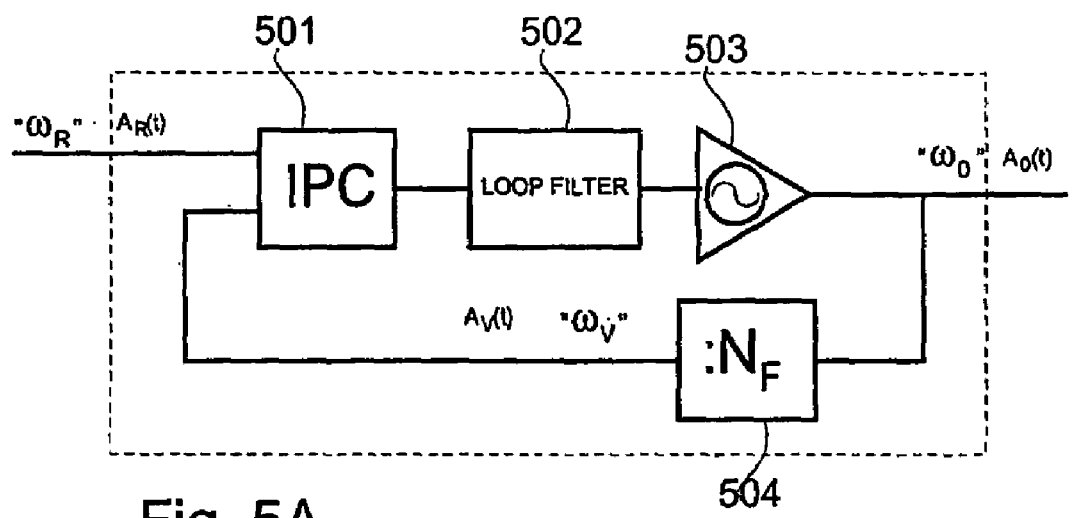
FIG. 5 illustrates a phase-locked loop according to the invention.

FIG. 5 illustrates a phase-locked loop including an incremental phase comparator, ie. a phase comparator according to the invention. As shown in FIG. 5a, the output of the incremental phase comparator (IPC) 501, i.e. is connected to a voltage controlled oscillator 503 via a loop filter 502. A reference signal is connected to a first input of the incremental phase comparator 501, i.e. to the input of the first register 208 (see FIGS. 2, 3 or 4), and the output of the voltage controlled oscillator 503 is connected to a second input of the incremental phase comparator 501 via a frequency divider 504. As illustrated in FIGS. 2, 3 and 4, the second input of the incremental phase comparator 501 may be connected to third register 211. Hereby, when an oscillation reference signal and an output signal of a voltage controlled oscillator is supplied as the first and the second input signals to the trigger means 205, 206, respectively, and when the second and the fourth registers 209, 212 are given a value representing a predefined phase step, the output of the first and the second accumulator represents an accumulated phase value of the reference signal and an accumulated phase value of the output of the voltage controlled oscillator, respectively.

Figure 5B:
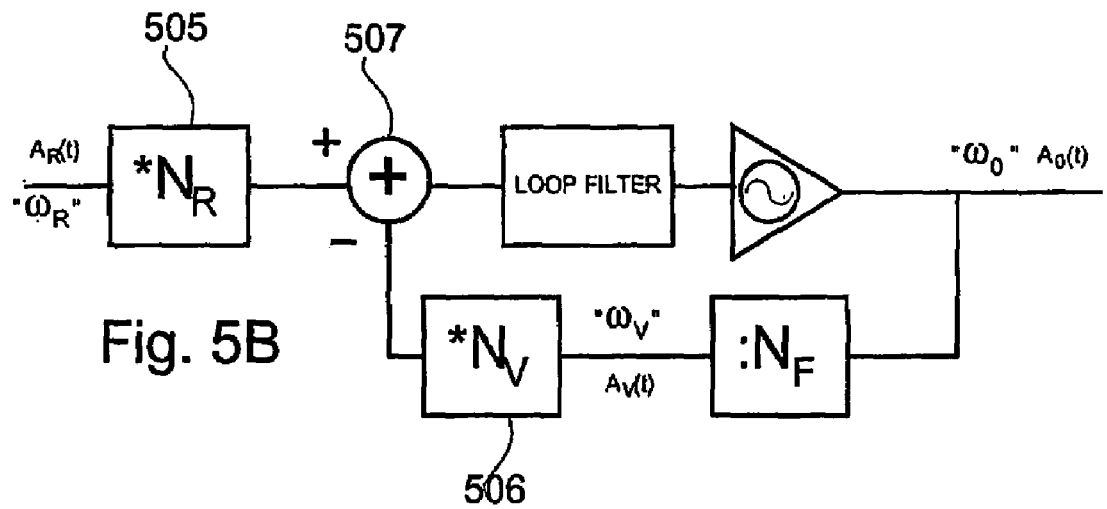

In FIG. 5b is illustrated how the incremental phase comparator 501 may be composed of a first and a second multiplication block 505, 506 corresponding to blocks 201 and 202, respectively, of FIG. 2, 3 or 4, and means or subtraction means for obtaining a phase error 507 from the outputs of blocks 505 and 506. For block 505 the integer $N_R$ is given as a multiplicand, corresponding to the predetermined phase step value $N_R$ of register 209, and for block 506 $N_V$ is given as a multiplicand, corresponding to the predetermined phase step value $N_V$ of register 212.

Figure 6:
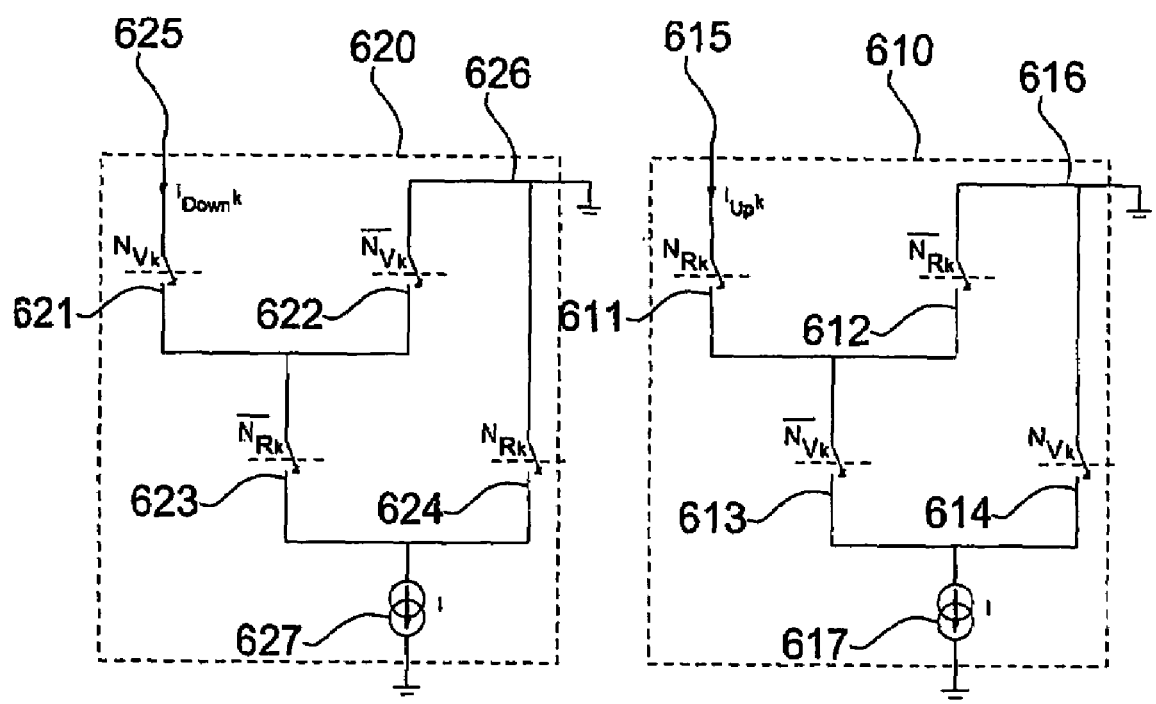
FIG. 6 shows two blocks with each block having a first one-bit combined logic digital-to-analogue converter according to the invention.

It has been found by the present inventors that if the systems of the block diagrams of FIGS. 3 and 4 are implemented using a standard implementation of the AND-functions and the digital-to-analogue converter (DAC) functions, then it may be difficult to maintain the pulse bandwidth product through the system. A solution to this problem may be to merge the AND and DAC functions together as illustrated in FIG. 6, which shows two blocks 610, 620, where each block has a first one-bit combined logic digital-to-analogue converter (logic DAC) according to the invention. Each logic DAC 610, 620, has switches 611-614, 621-624, a first current line 615, 625, a second current line 616, 626, and a constant current source 617, 627. The circuits 610, 620 are using a logic which may be denoted complementary current mode logic, where both the true and the inverse of an input signal is used to control the switches.

In FIG. 6 two digital signals $N_{Rk}$ and $N_{Vk}$ together with their inverse signals are input to the circuits 610, 620. Here $N_{Rk}$ may represent the value of bit k in a first digital signal $N_R$ and $N_{Vk}$ may represent the value of bit k in a second digital signal $N_V$, where $N_R$ and $N_V$ both have N bits, with the least significant bit having k=0 and the most significant bit having k=(N-1). According to an embodiment of the invention $N_R$ may be the output of the first accumulator 201 and $N_V$ may be the output of the second accumulator 202. For block 610, $N_{Rk}$ is controlling switch 611, the inverse of $N_{Rk}$ is controlling switch 612, the inverse of $N_{Vk}$ is controlling switch 613, and $N_{Vk}$ is controlling switch 614. The switches 611-614, 621-624 may be controlled so that they are closed by a logic "1" and open by a logic "0". From FIG. 6 it is seen for block 610 that when $N_{Rk}$ and the inverse of $N_{Vk}$ both represents a logic "1", then the circuit 610 is in a first conductive state, in which the constant current source 617 draws current from the first current line 615. For all other logic combinations of $N_{Rk}$ and the inverse of $N_{Vk}$ then the circuit 610 is in a second conductive state, in which the constant current source 617 draws current from the second current line 616. The current drawn from the first current line 615 of circuit 610 may be denoted $I_{Up}k$, and may represent a current output of the logic-DAC circuit 610. From the above discussion is should be clear that the logic operation performed by circuit 610 is a logic AND of the signals $N_{Rk}$ and the inverse of $N_{Vk}$, when the current of the first current line 615 is taken as output.

For block 620, $N_{Vk}$ is controlling switch 621, the inverse of $N_{Vk}$ is controlling switch 622, the inverse of $N_{Rk}$ is controlling switch 623, and $N_{Rk}$ is controlling switch 624. From FIG. 6 it is seen for block 620 that when $N_{Vk}$ and the inverse of $N_{Rk}$ both represents a logic "1", then the circuit 620 is in a first conductive state, in which the constant current source 627 draws current from the first current line 625. For all other logic combinations of $N_{Vk}$ and the inverse of $N_{Rk}$ then the circuit 620 is in a second conductive state, in which the constant current source 627 draws current from the second current line 626. The current drawn from the first current line 625 of circuit 620 may be denoted $I_{Down}k$, and may represent a current output of the logic-DAC circuit 620. From the above discussion is should be clear that the logic operation performed by circuit 620 is a logic AND of the signals $N_{Vk}$ and the inverse of $N_{Rk}$, when the current of the first current line 625 is taken as output.

A number of circuits 610 corresponding to the number of bits of the signals $N_R$ and $N_V$ may be arranged so that each circuit 610 has input signals corresponding to the same bit number k of $N_R$ and the inverse of $N_V$, and the corresponding current outputs $I_{Up}k$ may be used to obtain a resulting first analogue output or representation of the bit by bit AND operation of the signals $N_R$ and the inverse of $N_V$.

Similarly, a number of circuits 620 corresponding to the number of bits of the signals $N_R$ and $N_V$ may be arranged so that each circuit 620 has input signals corresponding to the same bit number k of $N_V$ and the inverse of $N_K$, and the corresponding current outputs $I_{Down}k$ may be used to obtain a resulting second analogue output or representation of the bit by bit AND operation of the signals $N_V$ and the inverse of $N_R$.

For the logic DAC circuits of FIG. 6 other logic operations such as NAND, OR or NOR can be obtained by having the signals $N_{Rk}$, the inverse of $N_{Rk}$, $N_{Vk}$ and the inverse of $N_{Vk}$ controlling the switches 611-614, 621-624 accordingly.

It should also be noted that for circuit 610 the same output is obtained if switch 611 is controlled by the inverse of $N_{Vk}$, $N_{Vk}$ is controlling switch 612, $N_{Rk}$ is controlling switch 613, and the inverse of $N_{Rk}$ is controlling switch 614. In the same way, for circuit 620 the same output is obtained if switch 621 is controlled by the inverse of $N_{Rk}$, $N_{Rk}$ is controlling switch 622, $N_{Vk}$ is controlling switch 623, and the inverse of $N_{Vk}$ is controlling switch 624.

Figure 7:
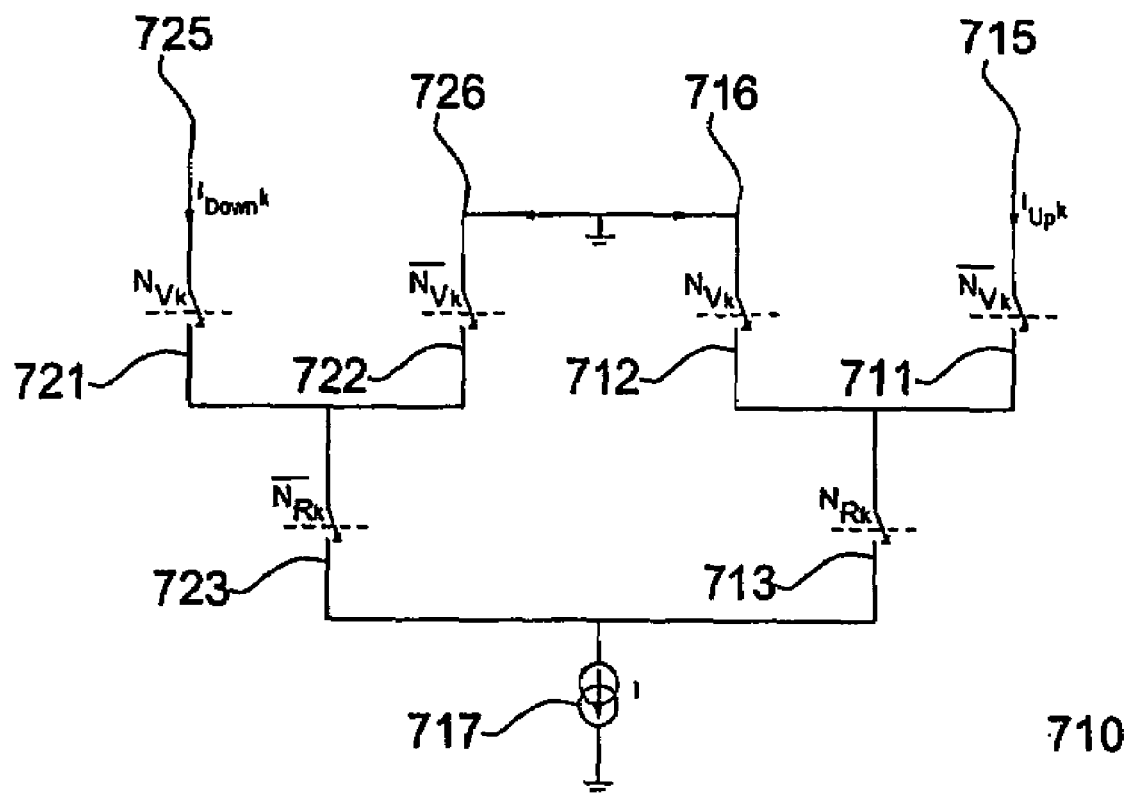
FIG. 7 shows one block of a second combined logic digital-to-analogue converter according to the invention performing the same function as the two blocks of FIG. 6.

According to the present invention, there is also provided a combined logic digital-to-analogue (combined logic DAC), which may perform the functions of blocks 610 and 620 by using a single constant current source. By using a single constant current source, the max. values of $I_{Up}k$ and $I_{Down}k$ may be substantially equal. This is illustrated in FIG. 7, which shows a combined logic digital-to-analogue converter 710 according to the invention performing the same function as the two blocks 610 and 620 of FIG. 6. The combined logic DAC 710 has switches 711-713, 721-723, a first current line 715, a second current line 716, a third current line 725, a fourth current line 726, and a constant current source 717. It is preferred that the second and fourth current lines 716, 726 are supplied from the same current line, as illustrated in FIG. 7.

In FIG. 7 the two digital signals $N_{Rk}$ and $N_{Vk}$ together with their inverse signals are input to the circuit 710 where the inverse of $N_{Vk}$ is controlling switch 711, $N_{Vk}$ is controlling switch 712, $N_{Rk}$ is controlling switch 713, $N_{Vk}$ is controlling switch 721, the inverse of $N_{Vk}$ is controlling switch 722, and the inverse of $N_{Rk}$ is controlling switch 723. Also here, the switches 711-713, 721-724 may be controlled so that they are closed by a logic "1" and open by a logic "0". From FIG. 7 it is seen that when $N_{Rk}$ and the inverse of $N_{Vk}$ both represents a logic "1", then the circuit 710 is in a first conductive state, in which the constant current source 717 draws current from the first current line 715. It is further seen that when $N_{Vk}$ and the inverse of $N_{Rk}$ both represents a logic "1", then the circuit 710 is in a third conductive state, in which the constant current source 717 draws current from the third current line 725.

For all other logic combinations of $N_{Rk}$ and $N_{Vk}$ then the circuit 710 is in a second conductive state, in which the constant current source 717 draws current from the second current line 716 or the fourth current line 726, where the second and the fourth current lines 716, 726 may be supplied from the same supply line. The current drawn from the first current line 715 may be denoted $I_{Up}k$, and may correspond to the current output of the logic-DAC circuit 610, and the current drawn from the third current line 725 may be denoted $I_{Down}k$, and may correspond to the current output of the logic-DAC circuit 620.

From the above discussion is should be clear that the logic operation performed by circuit 710 is a logic AND of the signals $N_{Rk}$ and the inverse of $N_{Vk}$, when the current of the first current line 715 is taken as output, and a logic AND of the signals $N_{Vk}$ and the inverse of $N_{Rk}$, when the current of the third current line 725 is taken as output.

Also here, a number of circuits 710 corresponding to the number of bits of the signals $N_R$ and $N_V$ may be arranged so that each circuit 710 has input signals corresponding to the same bit number k of $N_R$ and $N_V$ and their inverese, and the corresponding current outputs $I_{Up}k$ may be used to obtain a resulting first analogue output or representation of the bit by bit AND operation of the signals $N_R$ and the inverse of $N_V$, while the corresponding current outputs $I_{Down}k$ may be used to obtain a resulting second analogue output or representation of the bit by bit AND operation of the signals $N_V$ and the inverse of $N_R$.

Again, for the combined logic DAC circuit of FIG. 7 other logic operations such as NAND, OR or NOR can be obtained by having the signals $N_{Rk}$, the inverse of $N_{Rk}$, $N_{Vk}$ and the inverse of $N_{Vk}$ arranged for controlling the switches 711-713, 721-723 accordingly.

Figure 8:
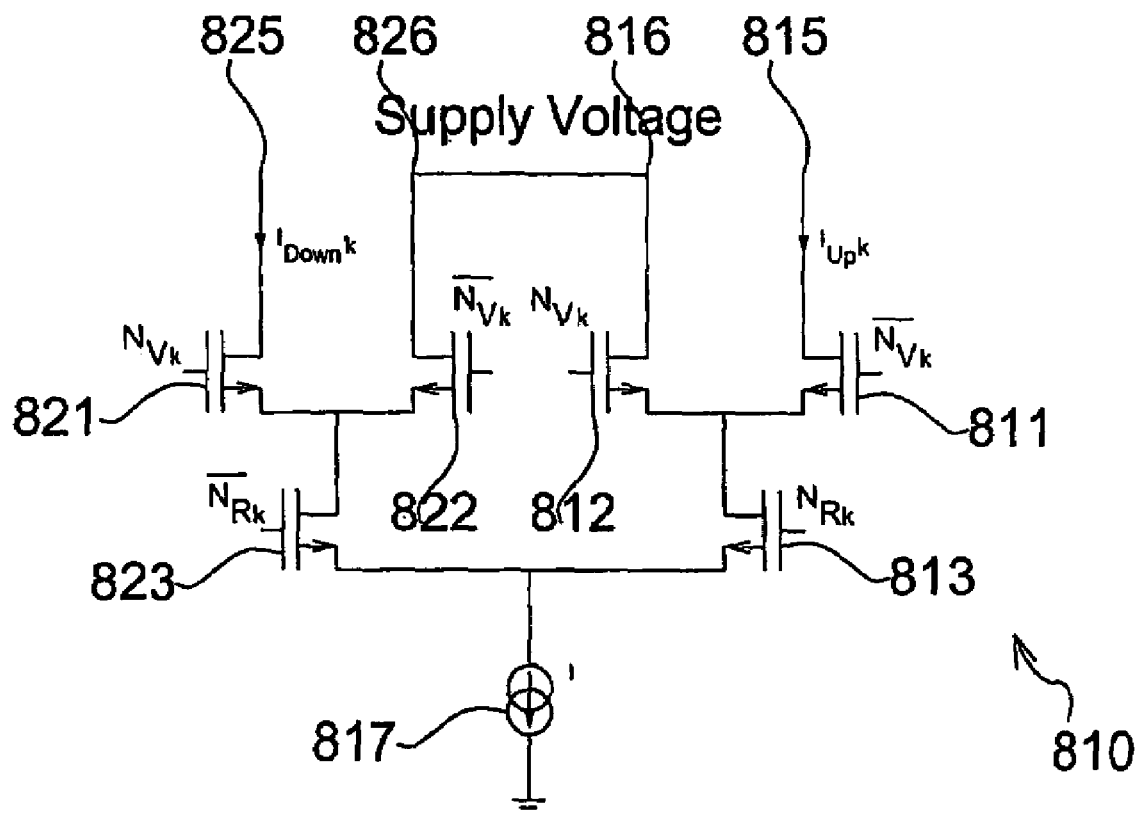
FIG. 8 shows a circuit example for a combined logic digital-to-analogue converter according to the converter of FIG. 7.

In FIG. 8 is shown a circuit example of a combined logic digital-to-analogue converter 810 according to FIG. 7. For the logic DAC 810 the components have the same numbering as for the circuit 710 except that the first digit is 8 instead of 7. The circuit 810 is implemented in NMOS technology using NMOS transistors for the switches 811-813, 821-823. However, a circuit having the same logic functionality may be produced in PMOS technology using PMOS transistors for the switches 811-813, 821-823. It should be noted that the circuits 610, 620 may also be produced using NMOS technology with NMOS transistors for the switches or PMOS technology with PMOS transistors for the switches.

Figure 9:
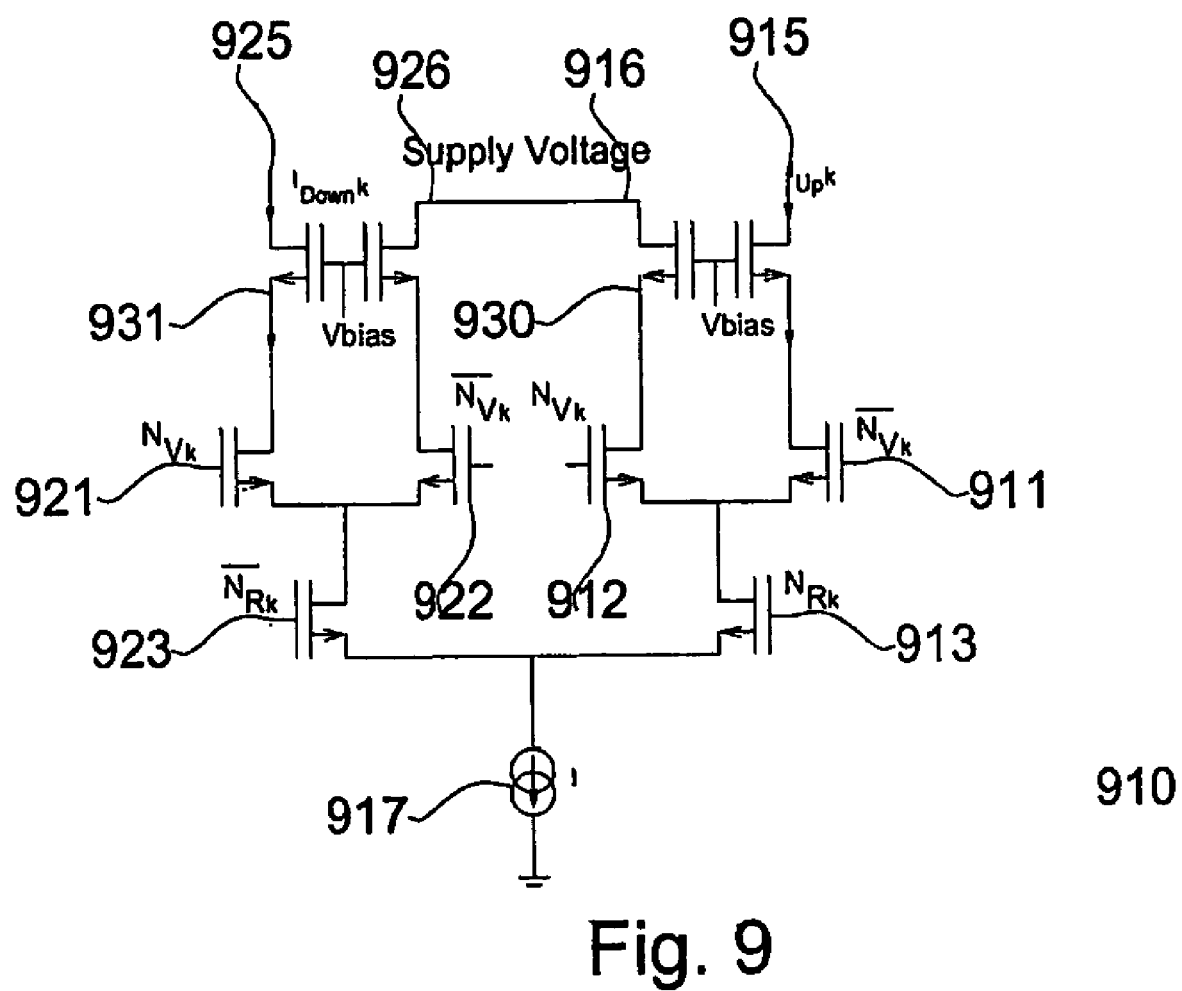
FIG. 9 shows another circuit example for a combined logic digital-to-analogue converter according to the converter of FIG. 7.

FIG. 9 shows another circuit example for a combined logic digital-to-analogue converter 910 according to FIG. 7. For the logic DAC 910 the components have the same numbering as for the circuit 910 except that the first digit is 9 instead of 7. The circuit 910 is also implemented using NMOS technology, and compared to the circuit 810, the circuit 910 has a first cascode stage 930 inserted in the first current line 915 and a second cascode stage 931 inserted in the third current line 925. The NMOS transistors of the stages 930, 931 are controlled by a reference gate voltage Vbias. The use of the cascode stages 930, 931 may in some cases lead to an improved performance.

A combination of the two one-bit logic DAC's 610 and 620 of FIG. 6 may be considered as a combined one-bit logic DAC, hereby referring to the inputs being the two single bits $N_{Rk}$ and $N_{Vk}$ together with their inverse signals. The combined one-bit logic DAC is using the two constant current sources 617, 627 and has the two current outputs $I_{Up}k$ and $I_{Down}k$. In the same way the combined logic DAC 710 may also be considered as a combined one-bit logic DAC, having the same input signals and current outputs as for the combination of 610 and 620, but only using a single constant current source.

Figure 10:
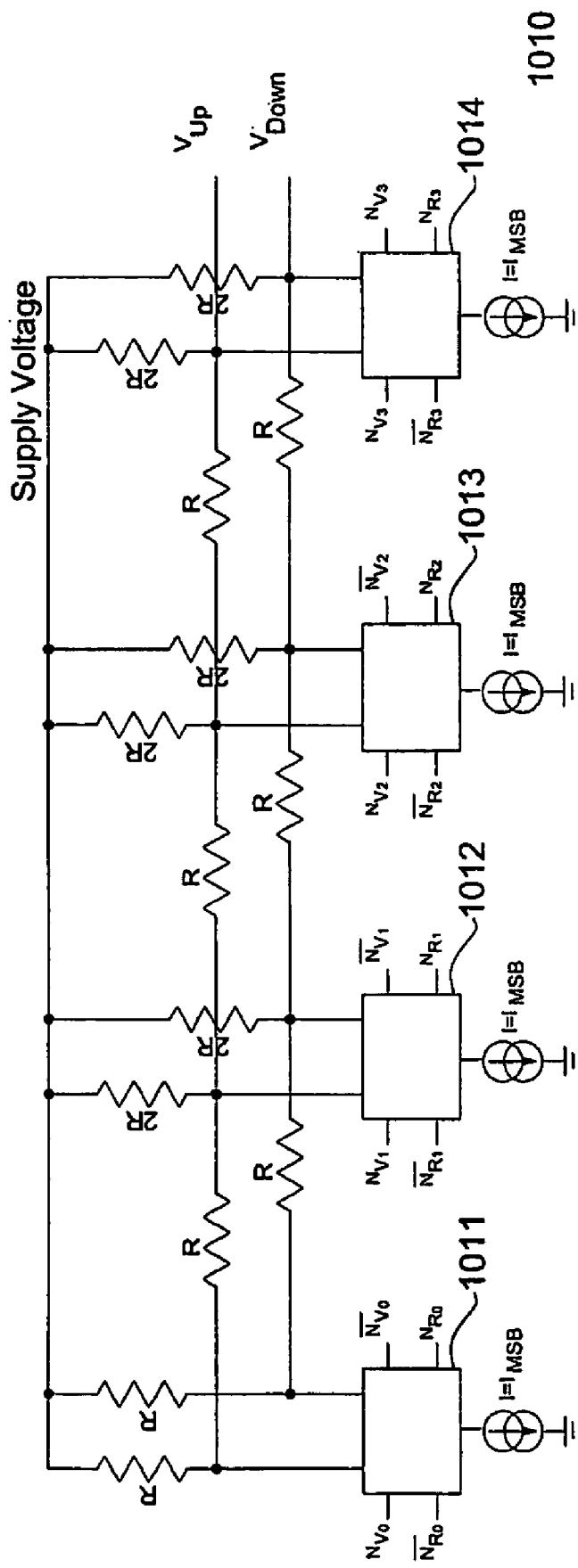
FIG. 10 shows a circuit example of a 4-bit combined logic digital-to-analogue converter according to the invention using a resistor network.

By combining a number of such one-bit logic DAC circuits, several different multi-bit logic DAC's may be implemented. One such basic implementation uses a resistor network, which may be the well-known R2R network. This is illustrated in FIG. 10, which shows a circuit 1010 comprising four one-bit combined logic DAC's according to the embodiment shown in FIG. 7, and having a R2R resistor network. The circuit 1010 may thus be considered as a 4-bit combined logic DAC, having the four one-bit combined logic DAC's 1011, 1012, 1013, 1014 and a resistor-to-resistor, R2R, network arranged as shown on FIG. 10. Here, each of the one-bit logic DAC's 1011-1014 has two current outputs $I_{Up}k$ and $I_{Down}k$, respectively and inputs $N_{Rk}$, $N_{Vk}$ together with their inverse signals, where k has the values 0, 1, 2, and 3. Each one-bit logic DAC 1011-1014 has a single constant current source with the same current value, where the current I is set equal to a value $I_{MSB}$. A voltage drop is generated in the R2R network by the currents $I_{Up}k$ resulting in a first analogue voltage output $V_{Up}$, and a voltage drop is generated in the R2R network by the currents $I_{Down}k$ resulting in a second analogue voltage output $V_{Down}$.

The functions of the combined one-bit logic DAC's 1011-1014 of the circuit 1010 may also be performed by using combined one-bit logic DAC's each comprising the circuits 610 and 620. In this case, each of the circuits 1011-1014 would then have two constant current sources of the same value, which would then be ½ $I_{MSB}$.

Figure 11:
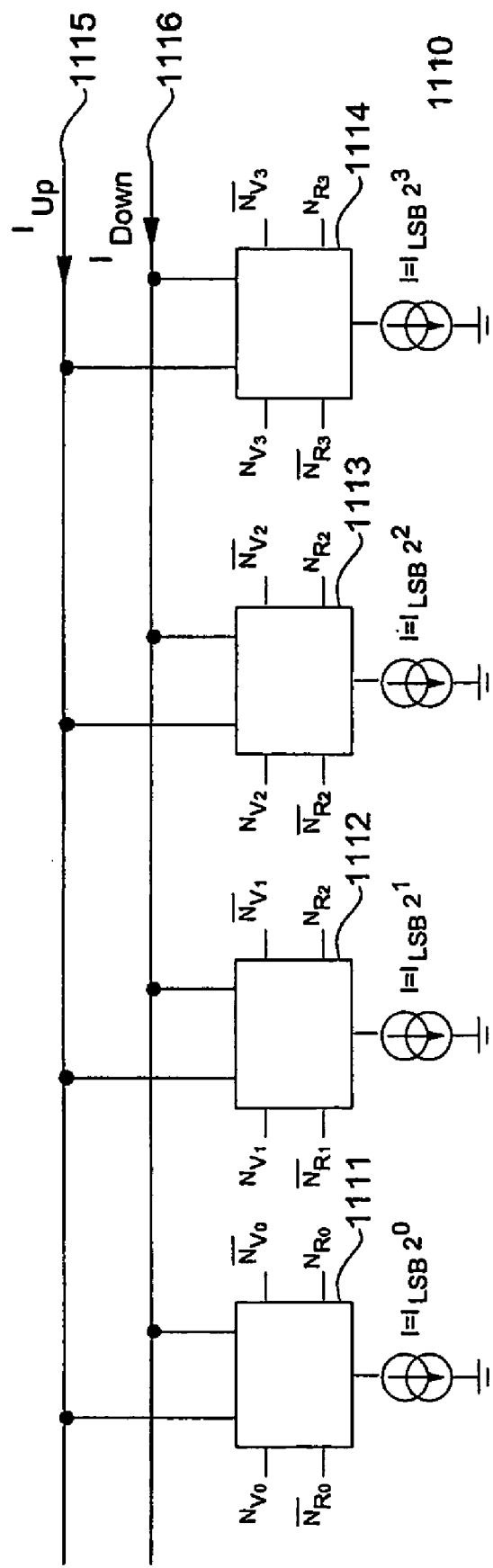
FIG. 11 shows another circuit example of a 4-bit combined logic digital-to-analogue converter according to the invention using constant current sources.

Another implementation of a multi-bit logic DAC is illustrated in FIG. 11, which shows another circuit example of a 4-bit logic DAC, which may be denoted a binary exponential current logic DAC. Here a circuit 1110 comprises four one-bit combined logic DAC's 1111-1114. Here, each of the one-bit logic DAC's 1111-1114 has two current outputs $I_{Up}k$ and $I_{Down}k$, respectively and inputs $N_{Rk}$, $N_{Vk}$, together with their inverse signals, where k has the values 0, 1, 2, and 3. According to one embodiment of the invention each of the circuits 1111-1114 may be a combined one-bit logic DAC according to the circuit 710 of FIG. 7. For binary exponential current logic DAC's the current drawn by the constant current sources will not be equal, so for circuit 1111, corresponding to k=0, the current of the constant current source is set to $I=I_{LSB}2^0$, for circuit 1112 having k=1, the current is set to $I=I_{LSB}2^1$, for circuit 1113 having k=2, the current is set to $I=I_{LSB}2^2$, and for circuit 1114 having k=3, the current is set to $I=I_{LSB}2^3$. Thus, for a N-bit binary exponential current logic DAC, the value of the constant current source corresponding to the one-bit logic DAC of bit k is set to $I=I_{LSB}2^k$, where k varies from 0 to N−1.

The functions of the combined one-bit logic DAC's 1111-1114 of the circuit 1110 may also be performed by using combined one-bit logic DAC's each comprising the circuits 610 and 620. In this case, each of the circuits 1111-1114 would then have two constant current sources of the same value, which would then be ½ $I_{LSB}2^k$.

For the circuit 1110 of FIG. 11, each of the current outpus $I_{Up}k$ of the circuits 1111-1114 is drawing current from the same supply line 1115 resulting in a first analogue current output $I_{Up}$, and each of the current output $I_{Down}k$ of the circuits 1111-1114 is drawing current from the same supply line 1116 resulting in a second analogue current output $I_{Down}$.

For the circuit 1110 it should be understood that it may be difficult to implement a number of current sources having different values varying with the bit number k as $I=I_{LSB}2^k$. Thus, according to the present invention there is provided another solution, for a multi-bit binary exponential current logic DAC. Instead of using a constant current source drawing a larger current, there is used a number of combined one-bit logic DAC's, which are arranged in parallel having the same inputs and having the current outputs $I_{Up}k$ and $I_{Down}k$ drawing current from the same supply line and having constant current sources of equal current $I=I_{LSB}$. Here, the number of parallel combined one-bit logic DAC's corresponding to bit k should be chosen so that the current of the parallel constant current sources equal the current $I=I_{LSB}2^k$, resulting in $2^k$ parallel one-bit logic DAC's for bit k, where k varies from 0 to N−1. So, for the 4-bit logic DAC 1110 of FIG. 11, then for circuit 1111, corresponding to k=0, the number of combined one-bit logic DAC's is 1, for circuit 1112 having k=1, the number of parallel combined one-bit logic DAC's is 2, for circuit 1113 having k=2, the number of parallel combined one-bit logic DAC's is $2^2$=4, and for circuit 1114 having k=3, the number of parallel combined one-bit logic DAC's is $2^3$=8.

The parallel combined one-bit logic DAC's used for the multi-bit binary exponential current logic DAC may correspond to the circuit 710 of FIG. 7, or they may correspond to the combined one-bit logic DAC's comprising the circuits 610 and 620. In this latter case, each of the parallel combined one-bit logic DAC's would then have two constant current sources of the same value, which would then be ½ $I_{LSB}$.

Figure 12:
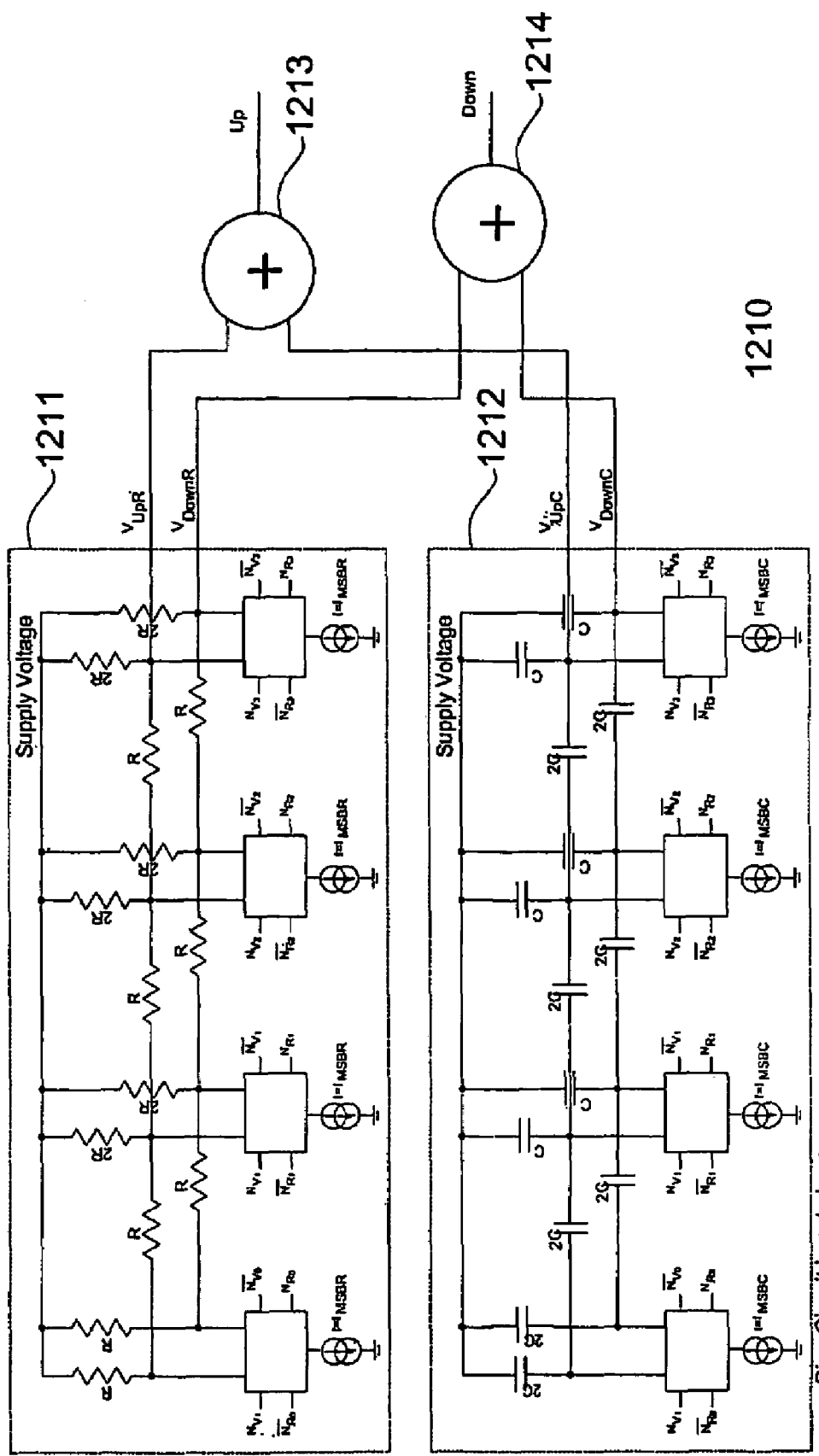
FIG. 12 shows a combination of the 4-bit converter of FIG. 10 using a resistor network and a 4 bit combined logic digital-to-analogue converter of the invention using a capacitor network.

Another multi-bit logic DAC according to the present invention may be implemented by use of a capacitor network, which may be a C2C (capacitor to capacitor) network arranged similar to the R2R network illustrated in FIG. 10. The present invention also covers embodiments of multi-bit logic DAC's comprising both a multi-bit logic DAC using a R2R network and a multi-bit logic DAC using a C2C network. This is illustrated in FIG. 12, in which a circuit 1210 is shown being combination of the 4-bit logic DAC of FIG. 10, 1211, using a resistor network, R2R, and a 4-bit logic DAC, 1212, using a capacitor network, C2C. The circuit 1210 further comprises a first adder circuit 1213 for adding voltage outputs $V_{Up}R$ and $V_{Up}C$ from 1211 and 1212, respectively, and a second adder circuit 1214 for adding voltage outputs $V_{Down}R$ and $V_{Down}C$ from 1211 and 1212, respectively, to thereby generate corresponding first and second analogue voltage outputs.

A multi-bit logic DAC according to the invention may be used in an incremental phase comparator according to the invention. This phase comparator may again be used in a phase-locked loop (PLL) structure. Here, the loop filter function of the PLL structure can be applied on the output of the multi-bit logic DAC, either as a passive or active filter depending on which multi-bit logic DAC structure is used and the requirements of the system. By applying the filter function, a subtraction of the second analogue output from the first analogue output may be part of the filter function.

Figure 13:
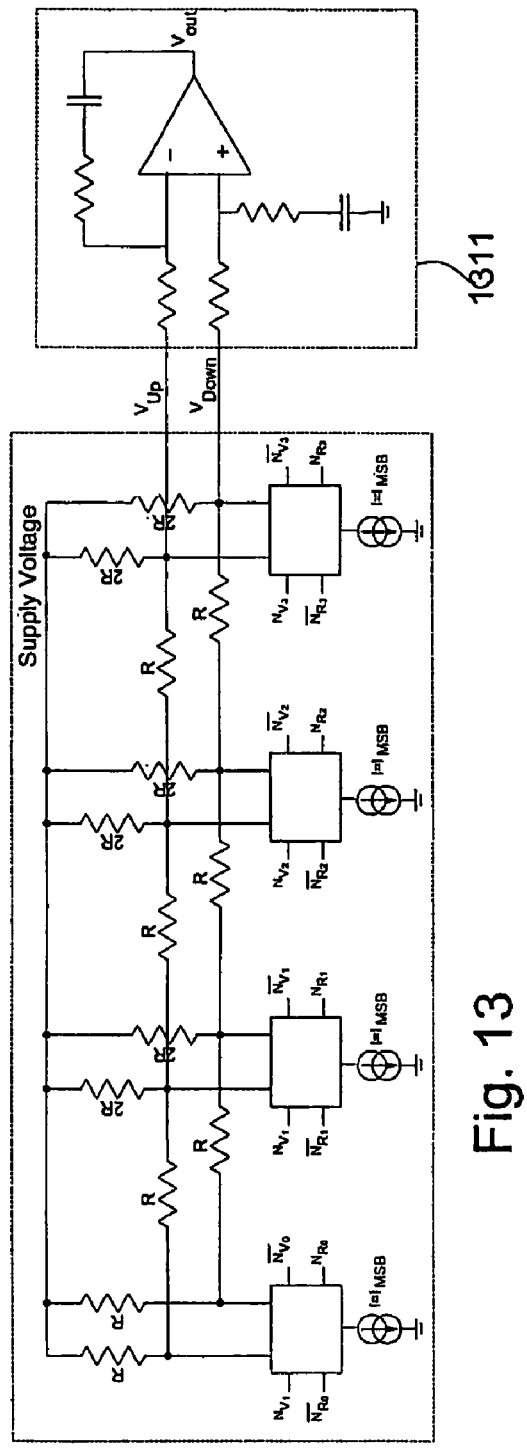
FIG. 13 shows an example of a loop filter using the circuit of FIG. 10.

FIG. 13 shows an example of an active loop filter 1311 using the circuit 1010 of FIG. 10. The filter 1311 comprises an OP-AMP being arranged as an integrator to implement a secord order PLL. The first input of the OP-AMP is the $V_{Up}$ output of circuit 1010, and the second input is the $V_{Down}$, output. By using $V_{Up}$ and $V_{Down}$ as the inputs for the OP-AMP, $V_{Down}$ is subtracted from $V_{Up}$.

Figure 14:
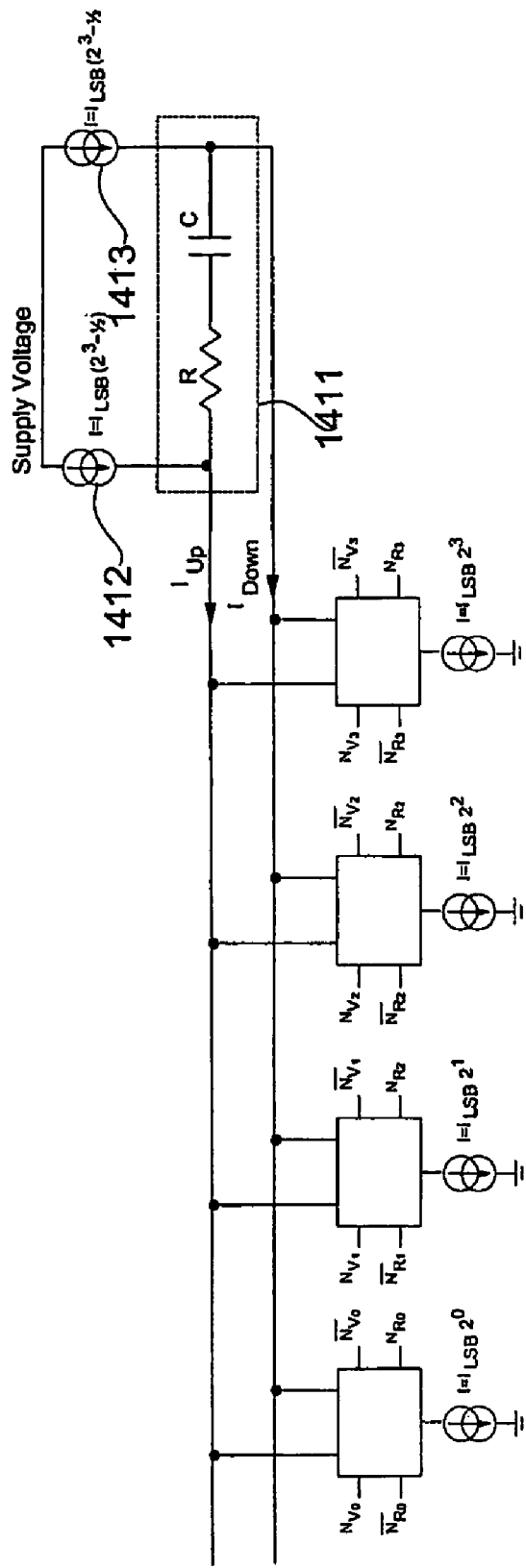
FIG. 14 shows an example of a loop filter using the circuit of FIG. 11.

FIG. 14 shows an example of a current mode transconductance integrator implementing a first order filter of a second order PLL 1411 using the circuit 1110 of FIG. 11. The filter 1411 comprises a capacitor C connected in series with a resistor R, with the resistor R further being connected to the first analogue output $I_{Up}$ of circuit 1110 and the capacitor C further being connected to the second analogue output $I_{Down}$ of circuit 1110. First and second constant current sources 1412, 1413 are supplying current to the first and second analogue current outputs $I_{Up}$ and $I_{Down}$. The resulting filter function is the difference between the $I_{Up}$ signal and $I_{Down}$ signal.

When comparing the phase-locked loop according to the invention with the prior art phase-locked loop of FIG. 1, it is found that the incremental phase comparator (IPC) replaces a phase detector according to the prior art, i.e. it has the same function as the prior art phase-locked loop of FIG. 1, but has a much better bandwidth and consequently faster lock-in time.

The invention has been described with a preferred embodiment. It is, however, possible to make changes and alterations to the shown example, while staying within the inventions idea. As an example, it is in the above description hinted that the digital numbers in the registers always are the same or will only change occasionally. It is, however, as an example possible to continuously change the digital numbers in the registers and thereby produce a pulse wide modulation of the output signal with the result that different phase and frequency modulation schemes (QPSK, FSK, GFSK, etc.) are achieved.

The invention claimed is:

1. A method for determining a phase error in response to a first signal and a second signal, said method comprising the steps of:
    generating a first reoccurring trigger event in response to the first signal,
    generating a second reoccurring trigger event in response to the second signal,
    incrementing a first phase value by a first predetermined increment value when the first trigger event occurs to obtain a first accumulated phase value represented by a binary number,
    incrementing a second phase value by a second predetermined increment value when the second trigger event occurs to obtain a second accumulated phase value represented by a binary number, and
    calculating or determining said phase error based on obtained first and second accumulated phase values, said phase error being represented by a binary number or one or more analogue signals,
    said method further comprising the steps of
    resetting the most significant bit of the first accumulated phase value and the most significant bit of the second accumulated phase value when the most significant bit of both said first accumulated phase value and said second accumulated phase value are simultaneously 1.

2. A method according to claim 1, wherein the phase error is represented by one or more an analogue signals.

3. A method according to claim 2, said method further comprising the steps of:
    performing a first logic bit by bit AND operation of the first accumulated phase value and the inverted second accumulated phase value, and generating a first analogue representation of said first logic bit by bit AND operation, and
    performing a second logic bit by bit AND operation of the second accumulated phase value and the inverted first accumulated phase value, and generating a second analogue representation of said second logic bit by bit AND operation.

4. A method according to claim 3, wherein the calculation of the phase error comprises generating one or more analogue phase error signal based on the second analogue representation of the second logic bit by bit AND operation and the first analogue representation of the first logic bit by bit AND operation.

5. A method according to claim 4, wherein the calculation of the phase error comprises performing an analogue subtraction of the second analogue representation from the first analogue representation.

6. A method according to claim 1, wherein two equal bits are reset whenever these bits are 1 at the same time.

7. A method according to claim 1, said method comprising the step of frequency dividing the first signal and/or the second signal, whereby the generation of the first and/or second reoccurring trigger event is performed in response to the frequency divided first and/or second signal, respectively.

8. A phase-locked loop comprising:
    a voltage controlled oscillator for generating an output signal and having a frequency control input for controlling the frequency of the output signal, and
    a phase comparator for deriving a control signal from a phase error detected in response to the received output signal and a reference signal, said control signal being coupled to the frequency control input of said voltage controlled oscillator, wherein the phase comparator includes:
    a first accumulator adapted to add a first predefined phase step value to a first accumulated phase value in response to a reoccurring event in the reference signal,
    a second accumulator adapted to add a second predefined phase step value to a second accumulated phase value in response to a reoccurring event in the received output signal, and
    means or arithmetic means for determining the phase error from the obtained first and second accumulated phase values,
    said phase comparator further including a first reset means for the most significant bit of the first accumulator, a second reset means for the most significant bit of the second accumulator, and a third AND-means, where the output of said third AND-means is connected to said first and said second reset means of said first and said second accumulator, where the most significant bit of said first accumulator is connected to a first non-inverting input of said third AND-means, and where the most significant bit of said second accumulator is connected to a second non-inverting input of said third AND-means.

9. A phase-locked loop according to claim 8, wherein the phase comparator includes a converter circuit having:
    means for performing a first logic bit by bit AND operation of the output of the first accumulator and the inverted output of the second accumulator, and for generating a first analogue representation of said first logic bit by bit AND operation, and
    means for performing a second logic bit by bit AND operation of the output of the second accumulator and the inverted output of the first accumulator, and for generating a second analogue representation of said second logic bit by bit AND operation.

10. A phase-locked loop according to claim 9, wherein the converter circuit comprises current mode logic circuits giving a current output for a two input AND operation, said current output being used for generating an analogue representation for a bit by bit AND operation.

11. A phase-locked loop according to claim 9, wherein the arithmetic means are adapted to obtain one or more analogue phase error signals based on the second analogue representation of the second logic bit by bit AND operation and the first analogue representation of the first logic bit by bit AND operation.

12. A phase-locked loop according to claim 11, wherein the arithmetic means comprises subtraction means being adapted for performing an analogue subtraction of the second analogue representation from the first analogue representation.

13. A phase-locked loop according to claim 8, further comprising a divider for dividing the frequency of the output signal, whereby the received output signal received by the phase comparator is a frequency-divided output signal.

14. A phase comparator for carrying out the method in accordance of claim 1, wherein the first signal is a reference signal and the second signal is an input signal, said phase comparator including:
    a first accumulator adapted to add a first predefined phase step value to a first accumulated phase value in response to a reoccurring event in said reference signal,
    a second accumulator adapted to add a second predefined phase step value to a second accumulated phase value in response to a reoccurring event in said input signal, and means or arithmetic means for determining the phase error based on the second accumulated phase value and the first accumulated phase value, said phase comparator further including a first reset means for the most significant bit of the first accumulator, a second reset means for the most significant bit of the second accumulator and a third AND-means, where the output of said third AND-means is connected to said first and said second reset means of said first and said second accumulator, where the most significant bit of said first accumulator is connected to a first non-inverting input of said third AND-means, and where the most significant bit of said second accumulator is connected to a second non-inverting input of said third AND-means.

15. A phase comparator according to claim 14, wherein the phase comparator includes a converter circuit having:

means for performing a first logic bit by bit AND operation of the output of the first accumulator and the inverted output of the second accumulator, and for generating a first analogue representation of said first logic bit by bit AND operation, and means for performing a second logic bit by bit AND operation of the output of the second accumulator and the inverted output of the first accumulator, and for generating a second analogue representation of said second logic bit by bit AND operation.

16. A phase comparator according to claim 15, wherein the converter circuit comprises current mode logic circuits giving a current output for a two bit AND operation, said current output being used for generating an analogue representation for a bit by bit AND operation.

17. A phase comparator according to claim 15, wherein the arithmetic means are adapted to obtain one or more analogue phase error signals based on the second analogue representation of the second logic bit by bit AND operation and the first analogue representation of the first logic bit by bit AND operation.

18. A phase comparator according to claim 17, wherein the arithmetic means comprises subtraction means being adapted for performing an analogue subtraction of the second analogue representation from the first analogue representation.

* * * * *